US012676600B2

(12) United States Patent
Van Zyl

(10) Patent No.: US 12,676,600 B2
(45) Date of Patent: Jul. 7, 2026

(54) TWO-STAGE SOLID-STATE MATCH

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 526 days.

(21) Appl. No.: 18/097,472

(22) Filed: Jan. 16, 2023

(65) Prior Publication Data

US 2023/0231543 A1     Jul. 20, 2023

Related U.S. Application Data

(60) Provisional application No. 63/299,766, filed on Jan. 14, 2022.

(51) Int. Cl.
H03H 11/28     (2006.01)
H01J 37/32     (2006.01)

(52) U.S. Cl.
CPC ....... H03H 11/28 (2013.01); H01J 37/32183 (2013.01); *H01J 2237/24564* (2013.01)

(58) Field of Classification Search
CPC ..... H03H 11/28; H03H 7/38; H01J 37/32183; H01J 2237/24564
USPC .......................................................... 333/32
See application file for complete search history.

(56) References Cited

U.S. PATENT DOCUMENTS

| | | | |
|---|---|---|---|
| 8,965,315 B2 * | 2/2015 | Balm | H03H 7/38 |
| | | | 341/122 |
| 2012/0188007 A1 | 7/2012 | Van Zyl et al. | |
| 2017/0345620 A1 | 11/2017 | Coumou et al. | |

OTHER PUBLICATIONS

PCT, International Preliminary Report on Patentability issued in PCT/US2023/010877, Jul. 25, 2024, 13 pages.
Kari Rodriguez, International Searching Report and Written opinion, Apr. 25, 2023, International Searching Authority, Alexandria, Virginia.

* cited by examiner

*Primary Examiner* — Andrea Lindgren Baltzell
*Assistant Examiner* — Abigail Amir Yaldo
(74) *Attorney, Agent, or Firm* — NOD Law PC

(57)     ABSTRACT

This disclosure describes systems, methods, and apparatuses for a two-stage solid state match having a load side and a source side; a first coarse stage and a second precision stage, wherein the first coarse stage is coupled between the second precision stage and the load side, and wherein the second precision stage is coupled between the source side and an input of the first coarse stage; the coarse first stage comprising at least one switched variable reactance element, wherein the coarse first stage is configured to map a load impedance connected to the load side to a first number of intermediate impedances at the input of the first coarse stage; and wherein the second precision stage is configured to map at least one of the intermediate impedances to a second number of input impedances at the source side.

18 Claims, 20 Drawing Sheets

100

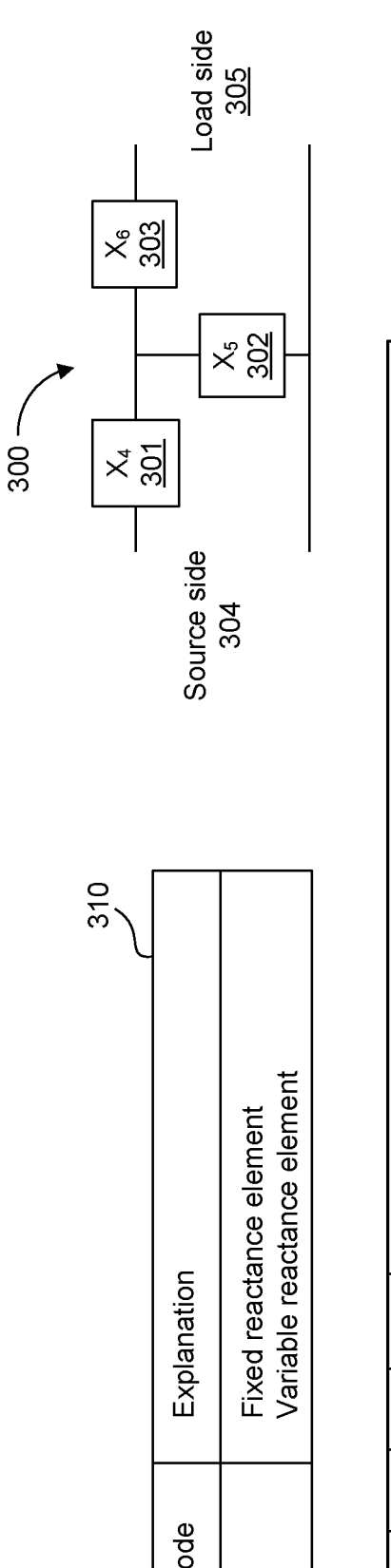

Load side
305

Source side
304

300

| Code | Explanation |
|------|-------------|
| F | Fixed reactance element |
| V | Variable reactance element |

310

| No. | X4 | X5 | X6 | Description |
|-----|----|----|----|-------------|
| 21 | F | F | F | Fixed T-match |
| 22 | F | F | V | Single variable load side series element T-match |
| 23 | F | V | F | Single variable shunt element T-match |
| 24 | F | V | V | Variable shunt element, variable load side series element T-match |
| 25 | V | F | F | Single variable source side series element T-match |
| 26 | V | F | V | Dual variable series element T-match |
| 27 | V | V | F | Variable source side series element, variable shunt element, T-match |
| 28 | V | V | V | Triple variable element T-match |

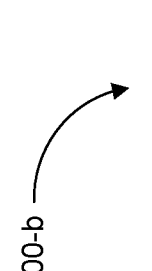
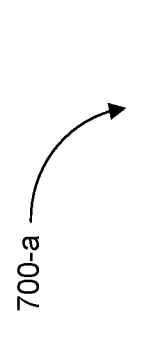
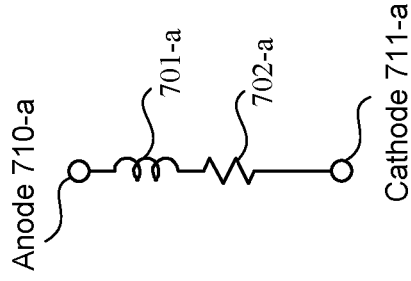
OFF STATE
Anode 710-b
701-b
703
702-b
Cathode 711-b
700-b
FIG. 7B
ON STATE
Anode 710-a
701-a
702-a
Cathode 711-a
700-a
FIG. 7A 900-b

ON STATE

N PIN DIODES

ON resistance = $R_{PIN\_ON}$ $R_{s\_1} = R_{s\_2} = R_{PIN\_ON}/N$

OFF STATE

N PIN DIODES

OFF resistance = $R_{PIN\_OFF}$ $R_{PIN\_OFF}/N$

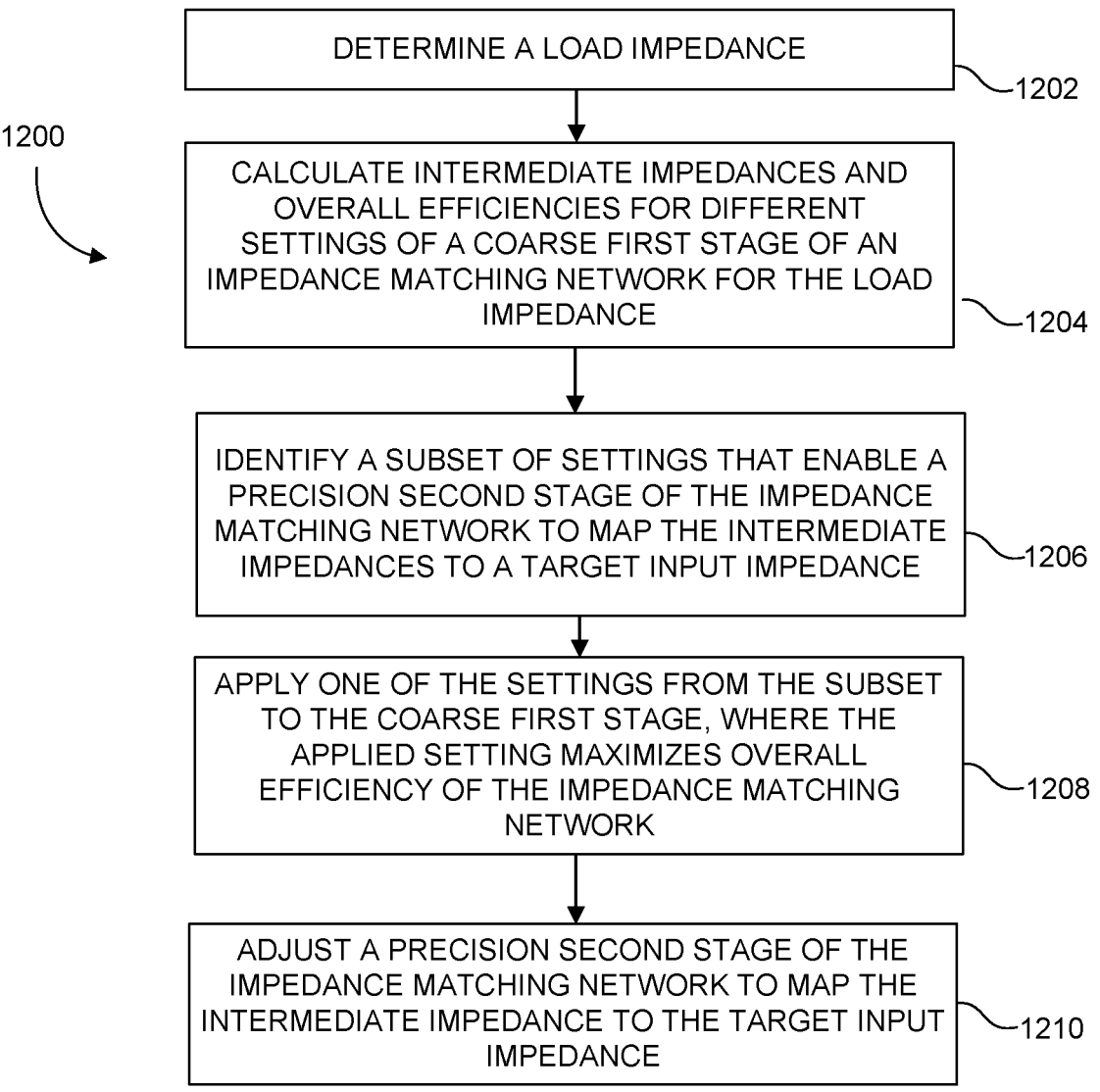

1200

DETERMINE A LOAD IMPEDANCE ~1202

CALCULATE INTERMEDIATE IMPEDANCES AND OVERALL EFFICIENCIES FOR DIFFERENT SETTINGS OF A COARSE FIRST STAGE OF AN IMPEDANCE MATCHING NETWORK FOR THE LOAD IMPEDANCE ~1204

IDENTIFY A SUBSET OF SETTINGS THAT ENABLE A PRECISION SECOND STAGE OF THE IMPEDANCE MATCHING NETWORK TO MAP THE INTERMEDIATE IMPEDANCES TO A TARGET INPUT IMPEDANCE ~1206

APPLY ONE OF THE SETTINGS FROM THE SUBSET TO THE COARSE FIRST STAGE, WHERE THE APPLIED SETTING MAXIMIZES OVERALL EFFICIENCY OF THE IMPEDANCE MATCHING NETWORK ~1208

ADJUST A PRECISION SECOND STAGE OF THE IMPEDANCE MATCHING NETWORK TO MAP THE INTERMEDIATE IMPEDANCE TO THE TARGET INPUT IMPEDANCE ~1210

DETERMINE A TARGET SUSCEPTANCE FOR A SWITCHED REACTANCE ELEMENT ⌐1402

OPEN AT LEAST ONE SWITCH IN SERIES WITH A SUSCEPTANCE HAVING AN OPPOSITE SIGN TO THAT OF THE TARGET SUSCEPTANCE ⌐1404

CLOSE AT LEAST ONE SWITCH IN SERIES WITH A SUSCEPTANCE HAVING THE SAME SIGN AS THAT OF THE TARGET SUSCEPTANCE ⌐1406

TWO-STAGE SOLID-STATE MATCH

CLAIM OF PRIORITY UNDER 35 U.S.C. § 119

The present application for patent claims priority to Provisional Application No. 63/299,766 entitled "TWO-STAGE SOLID STATE MATCH" filed Jan. 14, 2022, and assigned to the assignee hereof and hereby expressly incorporated by reference herein.

FIELD OF THE DISCLOSURE

The present disclosure relates generally to power systems. Specifically, but without limitation, the present disclosure relates to impedance matching networks.

DESCRIPTION OF RELATED ART

In the context of plasma processing, manufacturers use plasma processing chambers that utilize power (e.g., radio frequency (RF) power) to generate a plasma. In order to achieve efficient power transfer between a generator and a plasma load, an impedance-matching network ("match network") is often used to match the load impedance to a desired input impedance, typically (although not always) 50Ω. Plasma load impedance may vary depending on variables such as generator frequency, power, chamber pressure, gas composition, and plasma ignition. The match network accounts for these variations in load impedance by varying reactive elements (e.g., variable capacitors) to maintain the desired input impedance.

RF matching networks have long utilized variable vacuum capacitors, but solid-state matches (SSMs), which include discrete capacitors that are switched in or out to alter the value of a capacitor in a SSM, are now an alternative technology that are gaining popularity because SSMs can be switched more quickly, and faster switching enables faster matching, which enables better process control.

In some circumstances, however, it may be difficult to design a SSM with power handling and efficiency comparable to an equivalent vacuum-variable-capacitor-based match. A traditional approach with two variable reactance elements may fail to achieve similar performance as a vacuum-variable capacitor match. Thus, there is a need for a refined SSM topology that can help enhance the power handling and efficiency of SSMs.

The description provided in the description of related art section should not be assumed to be prior art merely because it is mentioned in or associated with this section. The description of related art section may include information that describes one or more aspects of the subject technology.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Aspects of the present disclosure generally relate to systems, methods, and apparatuses for solid state match (SSM) circuits, and more particularly for an impedance matching network that comprises two or more stages, including at least a first stage for transforming the load impedance to an intermediate impedance and a second stage for transforming the intermediate impedance to a desired input impedance (e.g., 50Ω). In some examples, two of the stages may also be referred to as coarse and precision (or fine) stages, respectively (and even intermediate, etc. if there are more than two stages). The use of a first stage (or coarse matching stage) helps limit the number of switches that need to handle very high voltages and currents to a small number (e.g., RMS values of 3 kV and 60 A and 20 switches); which helps optimize overall efficiency of the SSM circuit. Because of the limited number of switches, the initial impedance transformation is followed by a second stage for transforming the intermediate impedance to a target input impedance, e.g., 50Ω. In some examples, one or more other intermediate stages (e.g., third stage, fourth stage, etc.) may be employed between the first (coarse) stage and the second (precision) stage.

In some implementations, the coarse stage contains a minimum number of elements required to transform the load impedance to an intermediate impedance at which point the maximum voltages and currents to match the intermediate impedance to the desired input impedance (e.g., 50Ω) is significantly reduced. In one example implementation illustrated in FIG. 9A, as the load impedance is varied between $0.6-j50\Omega$ (where $j=\sqrt{-1}$) and $0.6+j50\Omega$ and the RMS load current is 60 A, the coarse (first) stage series element 922 may be subjected to a RMS voltage of 3300 V while the series variable reactance element in the precision (second) stage 910 may be subjected to a RMS voltage of 1000 V. This represents a 3.3-fold reduction in voltage stress. Since losses may be proportional to the square of voltage, other things being equal, this may equate to a roughly 10-fold reduction in losses. Similarly, the coarse (first) stage shunt element 930 may be subjected to a RMS voltage of 1100 V while the shunt variable reactance element ($C_{VAR\_2}$) in the precision (second) stage 910 may be subjected to a RMS voltage of 363 V. This represents a roughly 3-fold reduction in voltage stress and may represent a 9-fold reduction in losses. Similarly, while the coarse series element 922 may be subjected to an RMS current of 60 A, variable reactance elements in the precision second stage 910 may experience currents between 9 and 47 A. To illustrate why the use of a coarse first stage followed by a precision stage is beneficial, consider the 81.9% predicted efficiency into $0.6+j21\Omega$ as shown in FIG. 11D. In this example, the RMS load current is 60 A (the calculated efficiencies do not depend on the current; a specific current is simply used to illustrate the calculations) which means that 2160 W is delivered to the load and 478 W is dissipated in the match (2160/(2160+478)=0.819). To match this load to 50Ω, the coarse series element 922 reactance is set to −10Ω (i.e., an impedance of −j10Ω). The corresponding series resistance (corresponding to a reactance of −10Ω) of the coarse series element 922 is (as shown later) 0.116Ω. This means that the power dissipated in the coarse series element 922 is $60^2 \times 0.116 \approx 418$ W. If a precision first series element were used (rather than a coarse first stage followed by a precision second stage), it may require approximately 7 fractional reactance values (i.e., reactances of e.g., −7, −4.7, −3.1, −2, −1.3, −0.9, and −0.6 if a sub-binary sequence as taught in U.S. Pat. No. 10,623,012 were used) to match the load impedance to the desired input impedance with the desired accuracy. The additional series resistance resulting from 7 fractional values, assuming a similar design to the reactance module 925 of FIG. 9A, may be approximately 0.07Ω. The additional loss from these fractional series elements may then be approximately $60^2 \times 0.07 = 252$ W. The resulting efficiency of the match, if all other losses in the match were ignored, would then be $2160/(2160+418+252)=0.763$. Efficiency would thus reduce from 81.9% to a value no better than 76.3% or a reduction in efficiency of 5.6%. As shown in FIG. 11D, this would reduce the best efficiency of the SSM to below that of a comparable conventional match. As this example illustrates, the use of a coarse first stage followed by a precision second stage is highly beneficial in the design of high efficiency SSMs. U.S. Pat. No. 10,623,012 is incorporated herein by reference in its entirety.

For matching capacitive loads (e.g., 5–j30Ω) to a real input impedance (e.g., 50+j0Ω), a vacuum-variable-capacitor-based match comprising a series inductor may be limited by the inefficiency of the series inductor. For example, to match a reactance ranging from −50 to +50 to a 50Ω input impedance requires the series element reactance in a L-topology match to range from −50 to +75 (some reduction in range may be possible by restricting the load resistance range, but not much). Assuming the variable capacitor can achieve a maximum reactance of −10Ω, a series inductor reactance of 85Ω is required. This limits the efficiency into all loads, regardless of whether the inductance is required or not. In accordance with the aspects of the disclosure, the SSM circuit comprising two or more stages, including at least a first coarse stage and a second finer stage, can help reduce this inefficiency by switching out sections of the inductor when not needed.

In some embodiments, the second stage (or final stage) can be employed for the final impedance matching to the target input impedance. In some cases, the second stage may utilize variable reactance elements (e.g., variable inductors, variable capacitors, switched variable reactive elements containing capacitive and/or inductive elements) with finer adjustments than the coarse first stage to precisely match the intermediate impedance to the target input impedance. For example, with $Z_t$ the target input impedance, without adjusting the second stage, the coarse first stage may only be able to match the input impedance $Z_{in}$ so that, e.g., $$\frac{|Z_{in} - Z_t|}{|Z_{in} + Z_t^*|} < 0.3,$$

which in many applications may not be precise enough, while by adjusting variable reactance elements in the second stage one may be able to ensure that e.g., $$\frac{|Z_{in} - Z_t|}{|Z_{in} + Z_t^*|} < 0.04.$$

In some aspects, the techniques described herein relate to an apparatus including: an impedance matching network having a load side and a source side; a first coarse stage and a second precision stage, wherein the first coarse stage is coupled between the second precision stage and the load side, and wherein the second precision stage is coupled between the source side and an input of the first coarse stage; the coarse first stage including at least one switched variable reactance element, wherein the coarse first stage is configured to map a load impedance connected to the load side to a first number of intermediate impedances at the input of the first coarse stage; and wherein the second precision stage is configured to map at least one of the intermediate impedances to a second number of input impedances at the source side.

In some aspects, the techniques described herein relate to an apparatus, wherein the at least one switched variable reactance element includes at least two reactances, including an inductive reactance and a capacitive reactance, and wherein the at least two reactances are configured to be switched in and out of the at least one switched variable reactance element.

In some aspects, the techniques described herein relate to an apparatus, wherein the second number is greater than the first number.

In some aspects, the techniques described herein relate to an apparatus, wherein the first number of intermediate impedances is less than or equal to 400.

In some aspects, the techniques described herein relate to an apparatus, wherein the second number of input impedances is at least 100,000.

In some aspects, the techniques described herein relate to an apparatus, wherein: the at least one switched variable reactance element includes a plurality of switched variable reactance elements, including at least a first switched variable reactance element and a second switched variable reactance element; each of the first switched variable reactance element and the second switched variable reactance element includes at least two reactances of opposite signs that are configured to be switched in and out of a respective one of the first switched variable reactance element and the second switched variable reactance element; the first switched variable reactance element is a coarse series element coupled to the load side; and the second switched variable reactance element is a coarse shunt element coupled between the coarse series element and the second precision stage.

In some aspects, the techniques described herein relate to an apparatus, wherein the coarse shunt element includes at least a first switch arranged in series with an inductive reactance and a second switch arranged in series with a capacitive reactance.

In some aspects, the techniques described herein relate to an apparatus, wherein the coarse series element includes at least a first switch arranged in parallel with an inductive reactance and a second switch arranged in parallel with a capacitive reactance.

In some aspects, the techniques described herein relate to an apparatus, wherein the first coarse stage further includes a plurality of PIN diodes.

In some aspects, the techniques described herein relate to a method for operating a two-stage solid state match, the method including: determining a load impedance of a load coupled to the two-stage solid state match; identifying a plurality of settings for a coarse first stage of the two-stage solid state match; calculating, for each of the plurality of settings, an intermediate impedance and an efficiency for the two-stage solid state match when a respective setting is applied to the coarse first stage; identifying a target input impedance; selecting a setting for the coarse first stage, wherein the selecting is based at least in part on the target input impedance, the intermediate impedances, and the efficiencies, and wherein the selecting further includes applying the selected setting to the coarse first stage; and adjusting a precision second stage of the two-stage solid state match to transform an intermediate impedance corresponding to the selected setting to the target input impedance.

In some aspects, the techniques described herein relate to a method, wherein selecting the setting for the coarse first stage includes: identifying a subset of the plurality of the settings, wherein each setting in the subset corresponds to an intermediate impedance that is mappable by the precision second stage to the target input impedance; and identifying, from the subset of settings, the selected setting, wherein the selected setting maximizes efficiency of the two-stage solid state match.

In some aspects, the techniques described herein relate to a method, wherein a number of the plurality of settings is less than 400.

In some aspects, the techniques described herein relate to a method, wherein: the coarse first stage includes at least one switched variable reactance element, the at least one switched variable reactance element including a first switch in parallel to a first reactance and a second switch in parallel to a second reactance, and wherein setting the coarse first stage to the selected setting further includes: determining a target reactance for the at least one switched variable reactance element; closing the first switch; and opening the second switch; and wherein the first reactance has an opposite sign to that of the target reactance and the second reactance has a same sign as that of the target reactance.

In some aspects, the techniques described herein relate to a method, wherein: the coarse first stage includes at least one switched variable reactance element, the at least one switched variable reactance element including a first switch in series with a first reactance and a second switch in series with a second reactance and wherein setting the coarse first stage to the chosen setting includes: determining a target susceptance for the at least one switched variable reactance element; opening the first switch; and closing the second switch; and wherein the first reactance has a susceptance of opposite sign to that of the target susceptance and the second reactance has a susceptance with a same sign as that of the target susceptance.

In some aspects, the techniques described herein relate to a non-transitory, tangible computer readable storage medium, encoded with processor readable instructions to perform a method for switching two or more reactances in and out of a first stage of a two-stage solid state match, the method including: determining a load impedance of a load coupled to the two-stage solid state match; identifying a plurality of settings for the first stage of the two-stage solid state match, wherein the first stage includes at least one switched variable reactance element, the at least one switched variable reactance element including the two or more reactances, wherein the two or more reactances includes at least a first reactance and a second reactance of opposite signs; selecting a setting for the first stage; applying the selected setting to the first stage, wherein the applying includes: determining a target reactance for the at least one switched variable reactance element; switching out the first reactance of the two or more reactances, wherein the first reactance has an opposite sign than a sign of the target reactance; and switching in the second reactance of the two or more reactances, wherein the second reactance has a same sign as the sign the target reactance.

In some aspects, the techniques described herein relate to a non-transitory, tangible computer readable storage medium, wherein the two or more reactances include at least one inductive reactance and at least one capacitive reactance, and wherein the first reactance is an inductive reactance and the second reactance is a capacitive reactance.

In some aspects, the techniques described herein relate to a non-transitory, tangible computer readable storage medium, wherein the at least one switched variable reactance element includes: a first switched variable reactance element, wherein the first switched variable reactance element is a coarse series element; a second switched variable reactance element, wherein the second switched variable reactance element is a coarse shunt element; and wherein each of the coarse series element and the coarse shunt element include a plurality of reactances and a plurality of switches.

In some aspects, the techniques described herein relate to a non-transitory, tangible computer readable storage medium, wherein a number of the plurality of settings is less than 400.

In some aspects, the techniques described herein relate to a non-transitory, tangible computer readable storage medium, wherein the first stage further includes a plurality of PIN diodes.

In some aspects, the techniques described herein relate to a non-transitory, tangible computer readable storage medium, wherein selecting the setting for the first stage includes: identifying a subset of the plurality of the settings, wherein each setting in the subset corresponds to an intermediate impedance that is mappable to a target input impedance by a second stage of the two-stage solid state match; and identifying, from the subset of settings, the selected setting, wherein the selected setting maximizes efficiency of the two-stage solid state match.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

FIG. 3 is a block diagram illustrating sections that may be used in an impedance matching network, according to various aspects of the disclosure.

FIG. 7A illustrates a schematic diagram of an equivalent circuit for a PIN diode in the ON state, according to various aspects of the disclosure.

FIG. 7B illustrates a schematic diagram of an equivalent circuit for a PIN diode in the OFF state, according to various aspects of the disclosure.

FIG. 12 illustrates an example of a method for operating a multi-stage solid state match network, which comprises at least a coarse stage and a precision stage, according to various aspects of the disclosure.

DETAILED DESCRIPTION

Prior to describing the embodiments in detail, it is expedient to define certain terms as used in this disclosure.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the functionality and operation of possible implementations of a multi-stage solid state match (e.g., two-stage solid state match) according to various embodiments of the present disclosure. It should be noted that, in some alternative implementations, the functions noted in each block may occur out of the order noted in the figures. For example, two blocks shown in succession may, in fact, be executed substantially concurrently, or the blocks may sometimes be executed in the reverse order, depending upon the functionality involved. For instance, the operations of closing at least one switch parallel to a reactance having an opposite sign to that of the target reactance can be interchanged or performed concurrently with opening at least one switch parallel to a reactance having the same sign as that of the target reactance.

Figure 1:
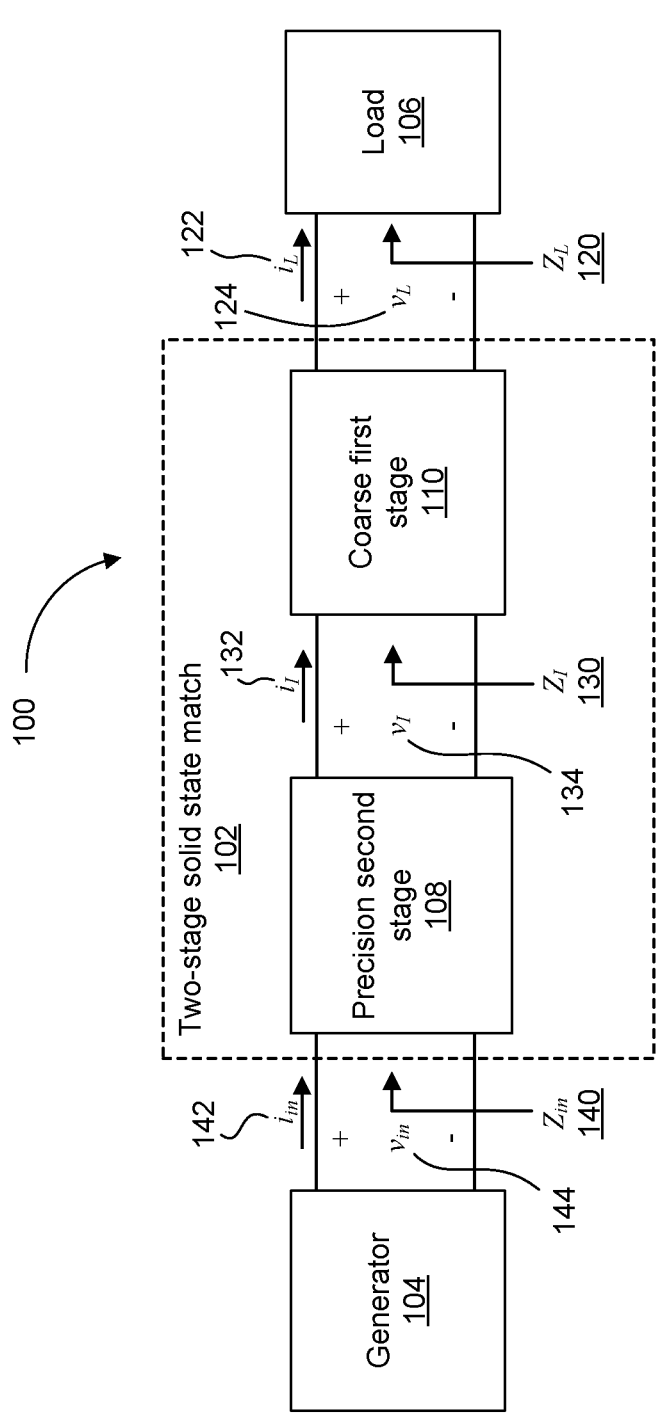
FIG. 1 is a block diagram illustrating a two-stage solid state match (SSM), which comprises a coarse stage and a precision stage, according to various aspects of the disclosure.

Referring to FIG. 1, shown is an example of a power system 100 comprising a generator 104, a two-stage solid state match (SSM) 102, and a load 106 with an interstage current vector 132 and an interstage voltage vector 134. In some examples, the load 106 may be a plasma load and the generator 104 may be a radio frequency (RF) generator. The two-stage SSM 102 transforms the load impedance, $Z_L$ 120, to a match input impedance, $Z_{in}$ 140, into which the generator 104 can efficiently deliver power. Because the match performs this function more efficiently than is possible in the art, a greater proportion of generator 104 power is delivered to the load. A typical value for the input impedance $Z_{in}$ is 50Ω, although this is not intended to be limiting. Non-50Ω input impedances are also contemplated in different embodiments, for instance, 25Ω, 37.5Ω, 75Ω, or even a complex impedance such as 30+j40Ω as may sometimes be utilized to improve stability of the power system 100 when the load is a nonlinear (e.g., plasma) load. In some instances, a coaxial cable with a characteristic impedance of 50Ω may be connected between the output of generator 104 and the input of the SSM 102 without further transforming the impedance presented to the generator away from 50Ω. If the load 106 is a plasma load, the load impedance $Z_L$ may depend on the amount of power delivered to the load. Said another way, the load 106 may be an example of a nonlinear load. In the case of a plasma load, the load impedance may further depend on the pressure and/or nature of gases and materials being processed in the plasma chamber. The two-stage SSM 102 reacts to changes in the load impedance $Z_L$ by switching reactive elements internal to the SSM 102 into and out of the match circuit, further described in relation to FIGS. 6A, 6B, and 9A-14.

In some instances, the two-stage SSM 102 comprises a first coarse stage 110 and a second fine or precision stage 108. The two-stage SSM 102 first transforms the load impedance $Z_L$ 120 to an intermediate impedance $Z_I$ 130 using the first or coarse stage 110. Next, the precision second stage 108 transforms the intermediate impedance $Z_I$ 130 to the target input impedance $Z_{in}$ 140. The coarse first stage 110 may comprise a sufficient number of switched reactance elements (e.g., shown as switched reactance elements 621, 622, 623 in FIG. 6A and/or switched reactance elements 661, 662, 663 in FIG. 6B), without more than the minimum needed, to transform the load impedance 120 to the intermediate impedance 130. In some circumstances, the coarse first stage 110 may be subjected to high voltages and currents (e.g., RMS voltages and currents of 3300 V and 60 A). Furthermore, by limiting the number of switched reactance elements in the coarse first stage 110, the electrical efficiency of the match network 102 can be enhanced as compared to the prior art. Electrical efficiency or efficiency of the SSM 102 can be calculated as the ratio of the power leaving the match (i.e. real($v_L i_L^*$) where $v_L$ 124 is the voltage vector at the match output and $i_L$ 122 is the match output current vector and $i_L^*$ is the complex conjugate of to the power entering the match (i.e. real($v_{in} i^*_{in}$) where $v_{in}$ 144 is the voltage vector at the match input and $i_{in}$ 142 is the match input current vector and $i^*_{in}$ is the complex conjugate of $i_{in}$). Because the load impedance $Z_L$ 120 can theoretically take on an infinite number of impedances and the coarse first stage 110 may only take on a limited number of configurations (e.g., 90 different configurations), the coarse first stage 110 may not be able to transform the load impedance ($Z_L$) 120 to the target input impedance 140 with adequate precision (e.g., for a target input impedance of 50Ω achieving a reflection coefficient $|Z_{in}-50|/|Z_{in}+50|$ as small as 0.3 when the target is <0.05), a precision second stage 108 may be employed to transform the intermediate impedance $Z_I$ 130 to the input impedance $Z_{in}$ 140.

Figure 2:
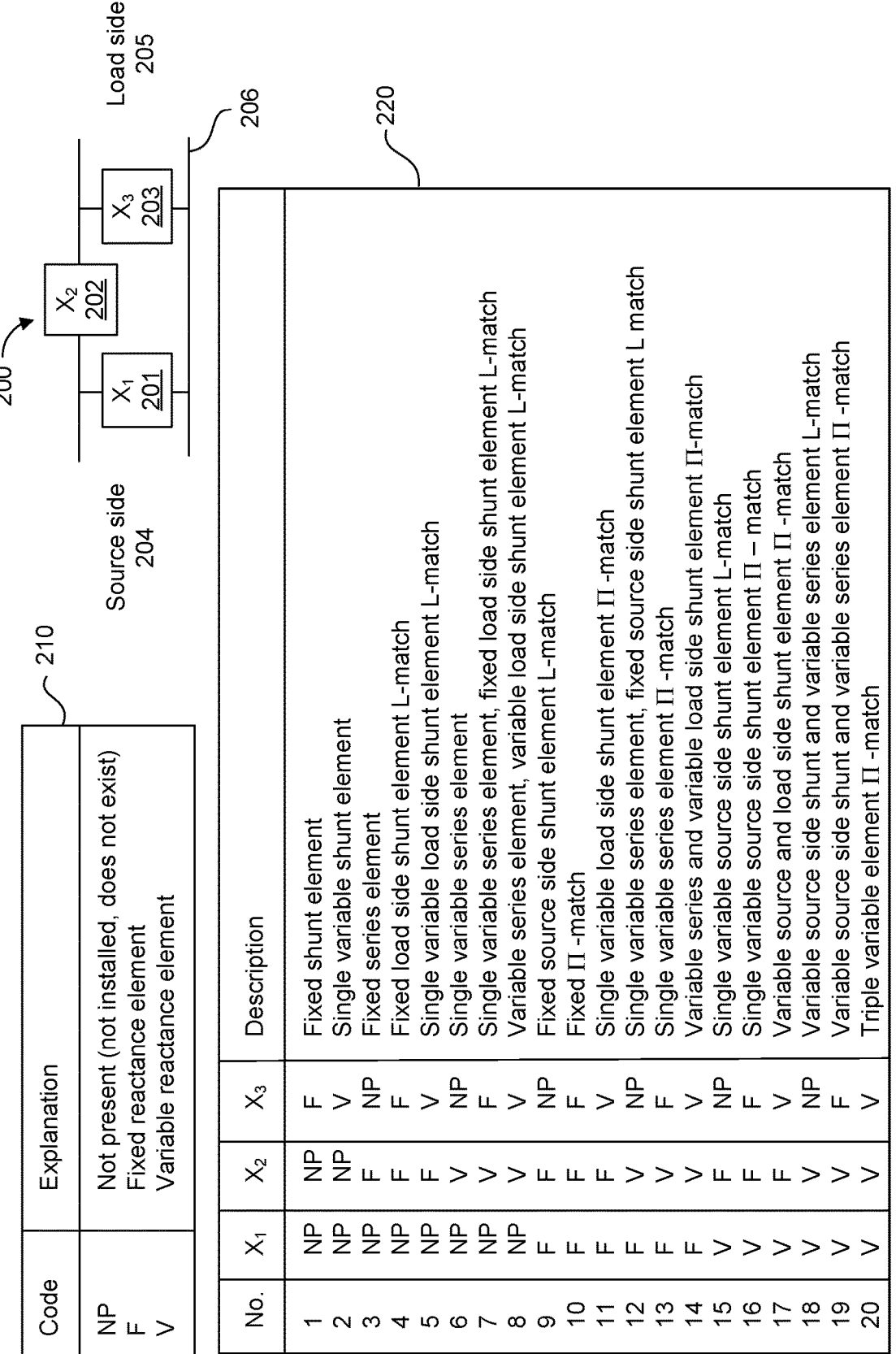
FIG. 2 is a block diagram illustrating sections that may be used in an impedance matching network, according to various aspects of the disclosure.

FIG. 2 illustrates a schematic diagram of a section 200 of a SSM that may be used in the design of an impedance matching network, according to various aspects of the disclosure. As seen, the section 200 comprises a source side 204, a load side 205, and a plurality of reactances $X_1$ 201, $X_2$ 202, and $X_3$ 203 coupled between the source side 204 and the load side 205. In FIG. 2 (and elsewhere in the disclosure), the source side 204 is the side closer to the generator (e.g., RF generator 104 in FIG. 1) while the load side 205 is the side closer to the load (e.g., plasma load 106 in FIG. 1). As shown, section 200 is a pi (Π) section of a ladder network where Π refers to the arrangement of the reactances $X_1$ 201, $X_2$ 202, and $X_3$ 203 in the shape of the Greek letter H. In power systems, the shunt elements $X_1$ 201 and $X_3$ 203 may be connected to a common node 206, typically referred to as ground or earth ground. In non-power applications, the ends of the reactances $X_1$ 201 and $X_3$ 203 may be connected to different nodes (i.e., in lieu of the connection to the common node 206) and a second series element (not shown) may be connected between those two nodes. In such cases, the section of the network more closely resembles a ladder with the rungs/legs of the ladder comprising the shunt elements $X_1$ and $X_3$ and a first rail of the ladder comprising the series element $X_2$ and the second rail of the ladder comprising the series element (not shown) connected between the bottom/lower ends of the shunt elements $X_1$ and $X_3$. In either case, the section 200 may be referred to as being part of a ladder network.

In some embodiments, different impedance matching topologies may be obtained from this Π network, for instance, by eliminating one or more of the reactances, selecting one or more of the reactances to be variable reactances, and/or selecting one or more the reactances to be fixed reactances. Table 220 read in conjunction with table 210 lists various examples of different impedance matching networks that may be derived from the section 200. While Table 220 lists 20 different examples of impedance matching networks that may be derived from the section 200, this is not intended to be limiting. Of the matching networks enumerated in column 1 of Table 220, configuration No. 18 comprising a variable source side shunt (i.e., variable $X_1$ 201) and a variable series element L-match (i.e., variable $X_2$ 202) is commonly used in conventional impedance matching networks. Additionally, configuration No. 17 comprising a fixed series element (i.e., fixed $X_2$ 202) and variable source and load side shunt Π-match (i.e., variable $X_1$ 202 and $X_3$ 203) is commonly used in solid state impedance matching networks, frequently in conjunction with the fixed Π-match (i.e., configuration No. 10 comprising fixed $X_1$ 201, $X_2$ 202, and $X_3$ 203). Section 200 may be used alone, or in combination with other sections, in the design of either the coarse first stage 110 or the precision second stage 108 of two-stage solid state match 102.

In the design of impedance matching networks for power systems, the elements $X_1$ 201, $X_2$ 202, and $X_3$ 203 are typically reactances and not impedances that may include a resistive part that is large compared to a reactive part because the use of impedances including resistive parts that are large compared to the reactive parts may lead to a lossy network that is typically not suitable in such applications. Typically, all real reactances have a small resistive part. For example, a reactance $X_1$ may ideally be a pure reactance with an impedance of $-j1000Ω$, but in practice may be realized as an impedance of $2-j1000Ω$. The ratio of the magnitude of the imaginary part of the impedance or the reactance (e.g., 1000 when the impedance is $2-j1000Ω$) to the real part or the resistance (e.g., 2 when the impedance is $2-j1000Ω$) may be referred to as the quality factor or 'Q'. In some instances, capacitors can have quality factors of several thousand while a high-quality inductor may have a Q of around 500.

FIG. 3 illustrates a schematic diagram of a section 300 of a SSM that may be used in the design of an impedance matching network, according to various aspects of the disclosure. As seen, the section 300 may comprise a source side 304, a load side 305, and one or more reactance elements $X_4$ 301, $X_5$ 302, and $X_6$ 303 arranged between the source side 304 and the load side 305. Similar to FIG. 2, in FIG. 3, source side 304 is the side towards the generator (e.g., generator 104 in FIG. 1) and load side 305 is the side towards the load (e.g., load 106 in FIG. 1).

As shown, section 300 is a T-section of a ladder network, where 'T' refers to the arrangement of the reactance elements $X_4$ 301, $X_5$ 302, and $X_6$ 303 in the shape of the letter 'T'. Additionally (i.e., in addition to the example configurations already listed in Table 220 of FIG. 2), one or more impedance matching topologies can be obtained or derived from the T network (or section 300) shown in FIG. 3. Specifically, one or more impedance matching topologies or configurations may be obtained by choosing which of the reactances (e.g., $X_3$, $X_4$, $X_5$) to make variable and which of the reactances to leave as fixed, further described below in relation to tables 320 and tables 310.

Table 320 read in conjunction with table 310 lists 8 additional impedance matching networks that may be derived from the T-section 300. Of the matching networks enumerated in column 1 of Table 320, configuration No. 26 comprising the dual variable series elements and fixed shunt element T-match (i.e., variable $X_4$ and $X_6$ and fixed $X_5$), is sometimes used in conventional impedance matching networks. Section 300 may be used alone, or in combination with other sections, in the design of either the coarse first stage 110 or the precision second stage 108 of two-stage solid state match 102.

Figures 4A, 4B:
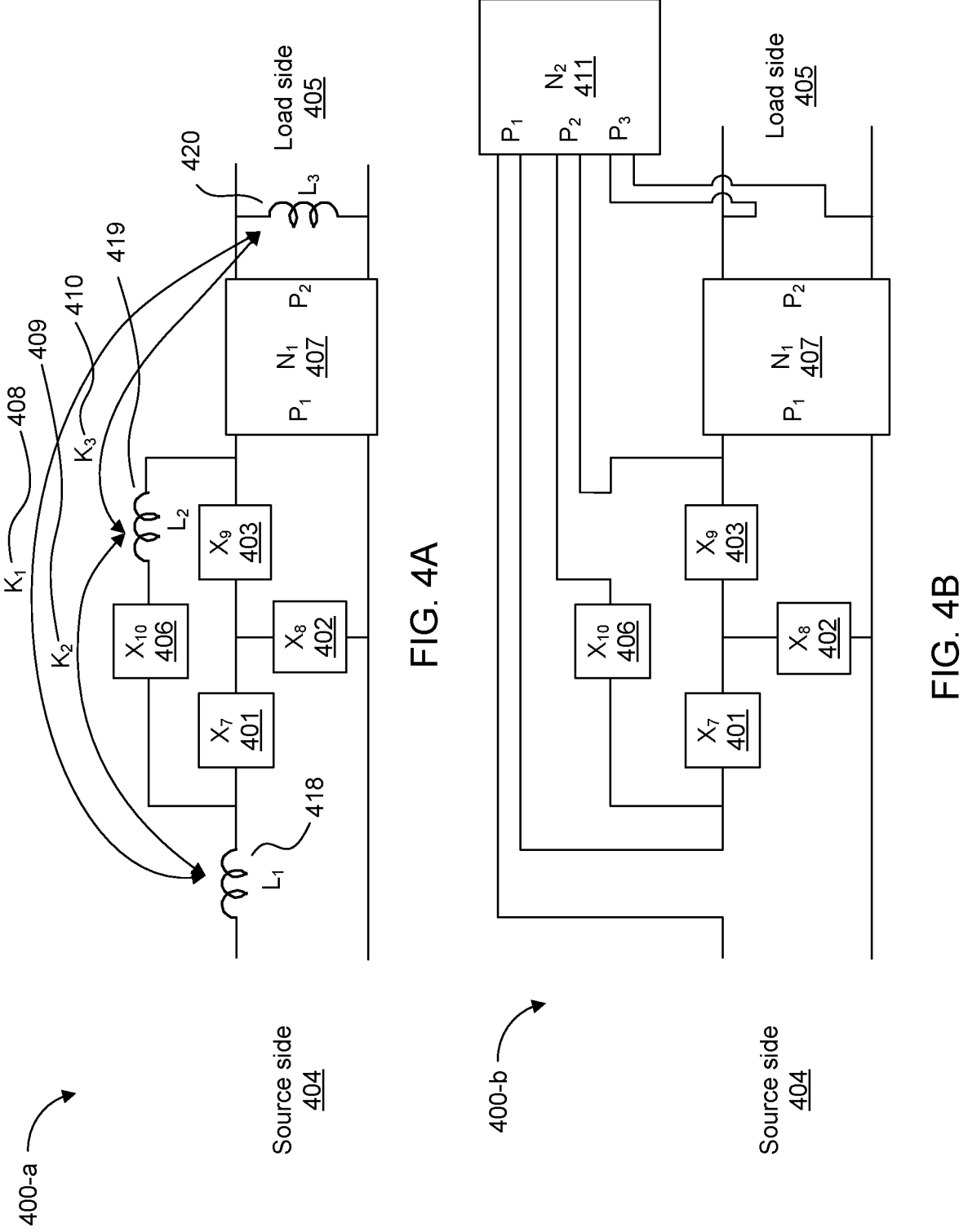
FIG. 4A is a block diagram illustrating a section that may be used in an impedance matching network, according to various aspects of the disclosure.
FIG. 4B is a block diagram illustrating a section that may be used in an impedance matching network, according to various aspects of the disclosure.

FIG. 4A illustrates a schematic diagram of a section 400-*a* with a source side of the network 404 and a load side of the network 405 that may be used in the design of an impedance matching network. FIG. 4A serves to illustrate that some simple networks cannot be reduced to ladder networks of series (e.g., $X_2$ 202 of FIGS. 2, $X_4$ 301 and $X_6$ 303 of FIG. 3) shunt (e.g, $X_1$ 201 and $X_3$ 203 of FIGS. 2 and $X_5$ 302 of FIG. 3) elements. Rather a circuit of reactance ($X_7$ 401, $X_8$ 402, and $X_9$ 403) elements may be needed. FIG. 4B is a depiction of the same section 400 of FIG. 4A showing that the inclusion of coupled inductors such as $L_1$ 418, $L_2$ 419 and $L_3$ 420 with couplings $K_1$ 408, $K_2$ 409, and $K_3$ 410 creates a 3-port network N2 411 connected to various nodes in section 400. In addition, section 400 may contain a 2-port network 407 such as a section of transmission line, or an element such as $X_{10}$ 406 connecting across more than one series element (e.g., $X_7$ 401 and $X_9$ 403) further preventing reduction of section 400 to a ladder network of series and shunt elements. Sections 400-*a* and 400-*b* may be used alone, or in combination with other sections, in the design of either the coarse first stage 110 or the precision second stage 108 of two-stage solid state match 102.

Figure 5:
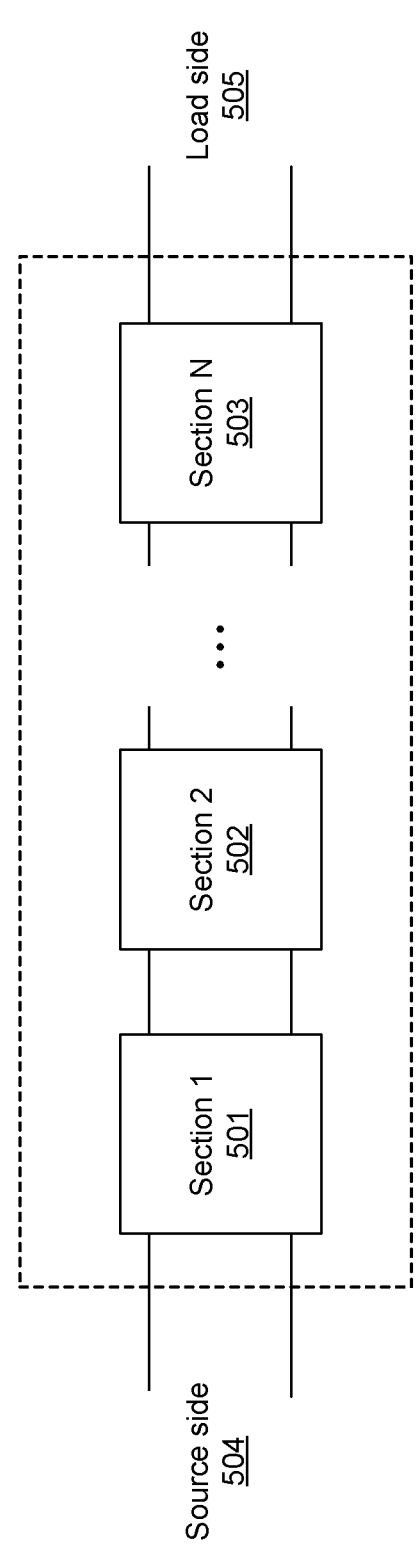
FIG. 5 is a block diagram illustrating cascading sections that may be used in an impedance matching network, according to various aspects of the disclosure.

FIG. 5 illustrates a block diagram of a cascade (or tandem) connection 500 of sections that may be used in the design of an impedance matching network, according to various aspects of the disclosure. As seen, FIG. 5 depicts a source side 504, a load side 505, and a plurality of cascaded sections (e.g., Section 501, Section 502, Section 503, etc.) coupled between the source side 504 and the load side 505. Although other types of connections (e.g., series connections) between various sections are possible, cascading of sections (e.g., sections 501, 502, 503, etc.) is more common in the design of impedance matching networks for power systems. In some embodiments, each section 501, 502, . . . 503 may be selected from the group consisting of sections 200, 300, 400-*a*, and/or 400-*b* of FIGS. 2, 3, 4A, and/or 4B, respectively. In turn, the connected sections in FIG. 5 may represent either an entire impedance matching network (e.g., the two-stage solid state match 102 of FIG. 1), or a stage of an impedance matching network such as the coarse first stage 110 or the precision second stage 108 of FIG. 1.

Figure 6A:
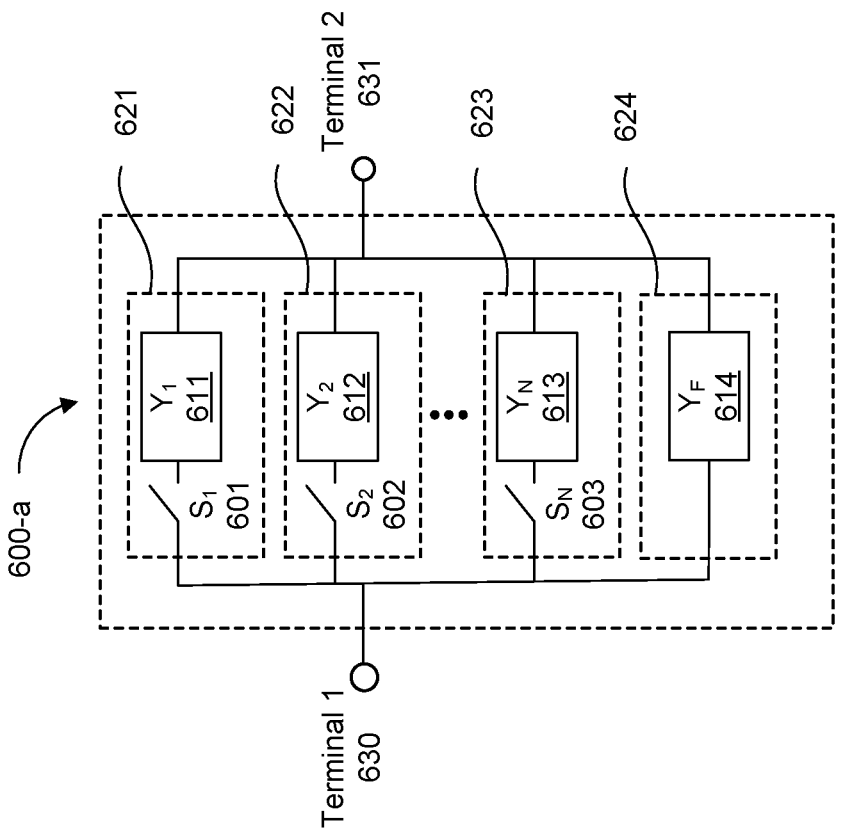
FIG. 6A illustrates a block diagram of a switched variable reactance element, according to various aspects of the disclosure.

FIG. 6A illustrates a block diagram of a switched variable reactance element 600-*a* that may be used in the design of an impedance matching network, according to various aspects of the present disclosure. As seen, the switched variable reactance element 600-*a* comprises a first terminal 630 and a second terminal 631. Furthermore, in variable reactance element 600-*a*, reactances $Y_1$, $Y_2$, . . . $Y_N$ 611, 612, . . . 613 are in series with switches $S_1$, $S_2$, . . . , $S_N$ 601, 602, . . . , 603. Closing the switch (e.g., switch $S_2$ 602) in series with a reactance (e.g., reactance $Y_2$ 612) adds the susceptance of said reactance to the total susceptance of the variable reactance element 600-*a*. In some embodiments, the variable reactance element 600-*a* also comprises a fixed reactance $Y_F$ 614. In some cases, the fixed reactance $Y_F$ 614 is not arranged in series with a switch (e.g., $S_{N+1}$). Variable reactance element 600-*a* may be used as the variable reactance element in a section of an impedance matching network. In one non-limiting example, the variable reactance element $X_1$ 201 in section 200 of FIG. 2 for the configuration No. 18 in table 220 may be implemented using the variable reactance element 600-*a* described in relation to FIG. 6A. In turn, section 200 of FIG. 2 containing variable reactance element $X_1$ 201 may be used as either the coarse first stage

Figure 9A:
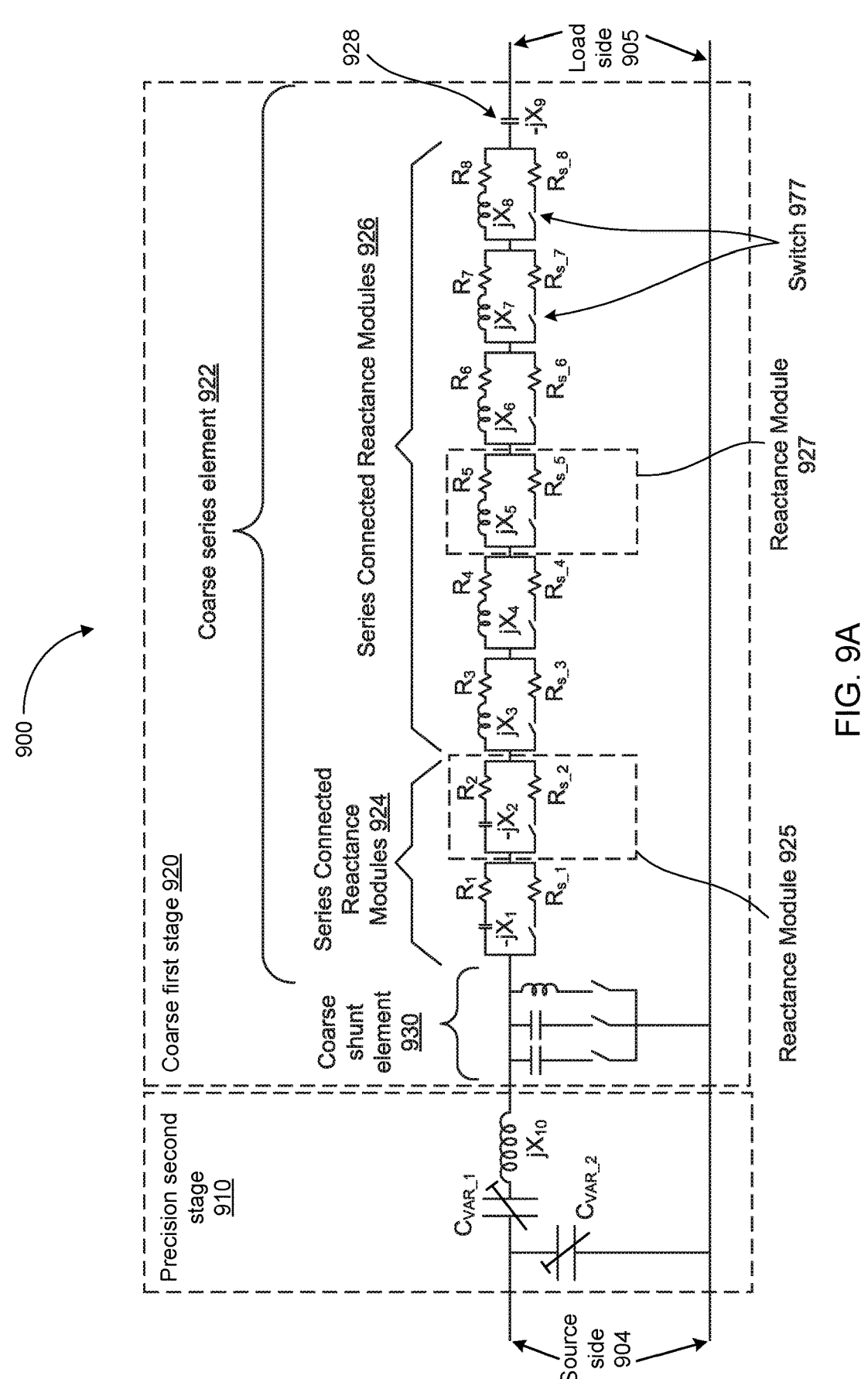
FIG. 9A illustrates a circuit diagram of a two-stage solid state match, which comprises a coarse stage and a precision or fine stage, according to various aspects of the disclosure.
Figure 9B:
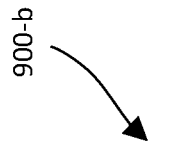
FIG. 9B depicts N PIN diodes coupled in parallel, where the N PIN diodes may be used to implement any of the switches of the switched variable reactance elements in FIG. 9A, according to various aspects of the disclosure.
Figure 9C:
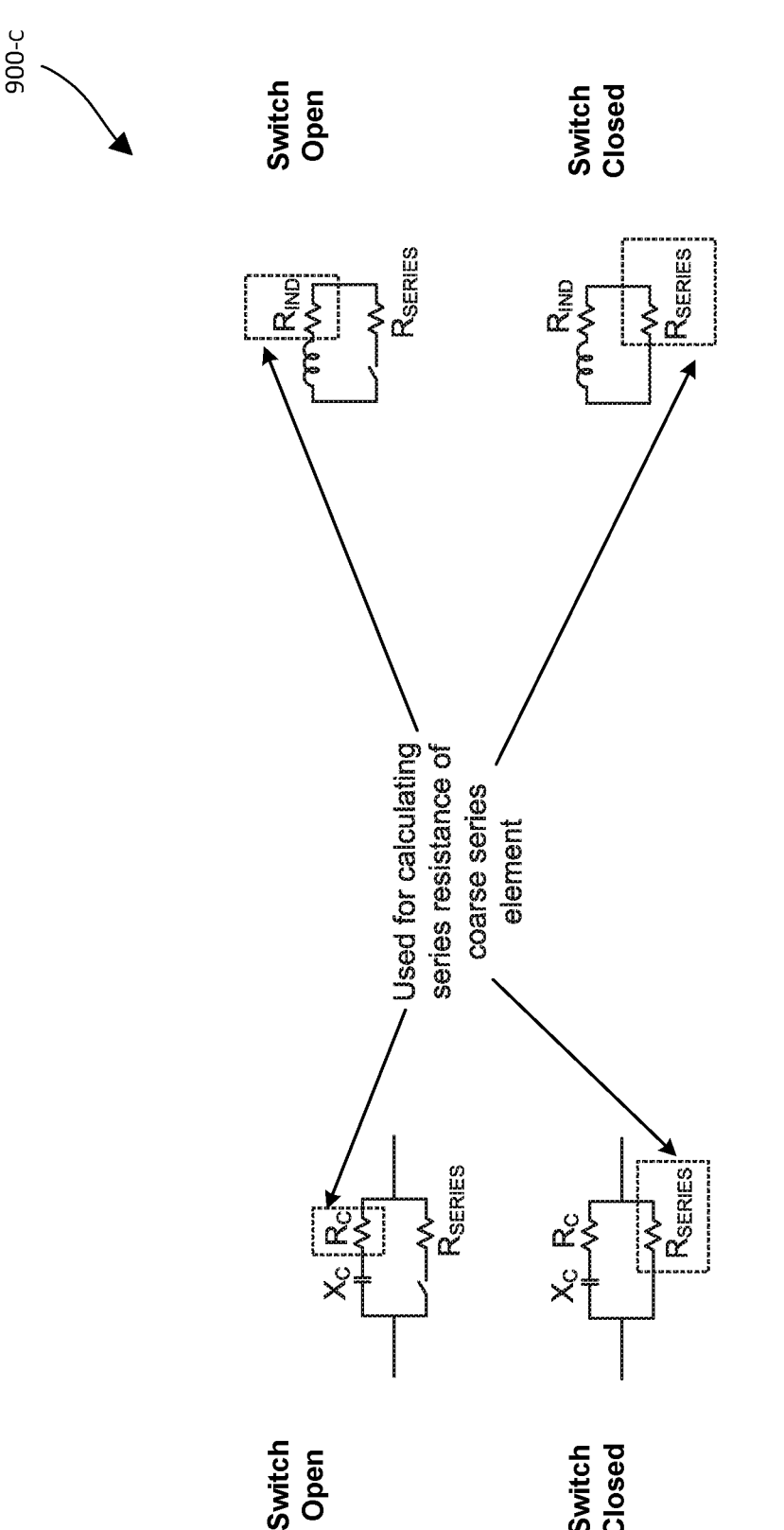
FIG. 9C illustrates switched variable reactance elements having reactances of opposite signs, according to various aspects of the disclosure.

110 or the precision second stage 108 of two-stage solid state match 102 in power system 100 of FIG. 1. In some cases, the coarse shunt element 930 in FIG. 9A is similar or substantially similar to the switched variable reactance element 600-*a*. Switched variable reactance element 600-*a* may be used as a variable reactance element in either a series (e.g., $X_2$ 202 in FIGS. 2, $X_4$ and $X_6$ in FIG. 3), shunt (e.g., $X_1$ and $X_3$ in FIG. 2, $X_5$ in FIG. 3), or other (e.g., $X_{10}$ in FIG. 4A) application in either the coarse first stage 110 or precision second stage 108 of two-stage SSM 108 of FIG. 1.

Figure 6B:
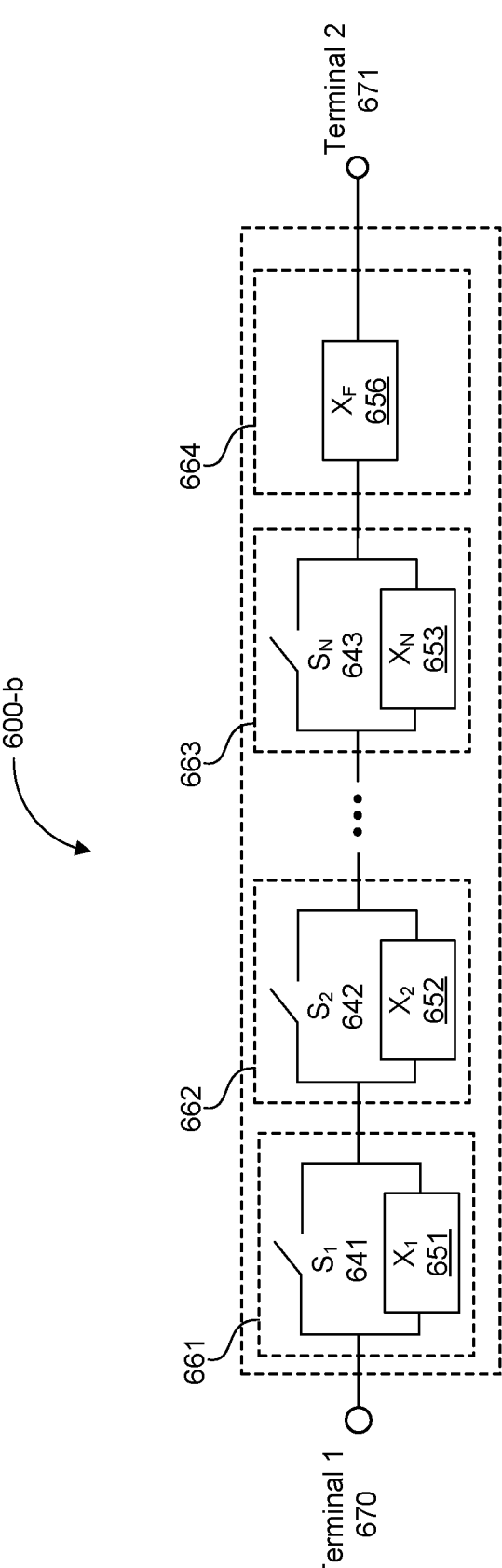
FIG. 6B illustrates a block diagram of a switched variable reactance element, according to various aspects of the disclosure.

FIG. 6B illustrates a block diagram of a switched variable reactance element 600-*b* that may be used in the design of an impedance matching network, according to various aspects of the present disclosure. As seen, the switched variable reactance element 600-*b* is coupled between (or comprises) a first terminal 670 and a second terminal 671. Furthermore, in variable reactance element 600-*b*, reactances $X_1$, $X_2$, . . . $X_N$ 651, 652, . . . 653 are shunted by (in parallel with) switches $S_1$, $S_2$, . . . , $S_N$ 641, 642, . . . , 643. Opening the switch (e.g., switch 641) shunting a reactance (e.g., reactance 651) adds the reactance to the total reactance of the variable reactance element 600-*b*. In some embodiments, the variable reactance element 600-*b* can also contain a fixed reactance $X_F$ 656 that is not in shunted by a switch (e.g., switch $S_{N+1}$). Variable reactance element 600-*b* may be used as the variable reactance element in a section of an impedance matching network, e.g., as $X_1$ 201 in section 200 of FIG. 2 in a topology that has a variable reactance for $X_1$ such as the L-match listed as No. 18 in table 220 of FIG. 2. In some cases, the coarse series element 922 in FIG. 9A is similar or substantially similar to the switched variable reactance element 600-*b*. Switched variable reactance element 600-*b* may be used as a variable reactance element in either a series (e.g., $X_2$ 202 in FIGS. 2, $X_4$ and $X_6$ in FIG. 3), shunt (e.g., $X_1$ and $X_3$ in FIG. 2, $X_5$ in FIG. 3), or other (e.g., $X_{10}$ in FIG. 4A) application in either the coarse first stage 110 or precision second stage 108 of two-stage SSM 108 of FIG. 1.

PIN Diodes

PIN diodes are electrical devices having an un-doped or lightly doped intrinsic (I) semiconductor region sandwiched between heavily doped regions, and have various applications, for instance, as switching devices in impedance matching networks, especially in radio frequency (RF) matching networks. The "PIN" designation derives from the three-part "sandwich" structure of this diode: a lightly doped intrinsic region (I) positioned between a heavily doped p-type semiconductor (P) and a heavily doped n-type semiconductor (N).

In general, PIN diodes obey conventional diode behavior at low frequency input signals, but for higher frequency input signals they operate as a resistor in the forward biased or ON-state, and as a capacitor in the reverse biased or OFF-state. As such, PIN diodes are often utilized in radio frequency (RF) applications, e.g., in attenuators and fast switches where high isolation and low loss are desired. In some circumstances, PIN diodes can be turned ON with a DC current that is a small fraction of the RF current being switched and turned OFF by reverse biasing the PIN diode. PIN diodes are attractive switches because they combine low ON-state resistance with very low OFF-state losses. In some cases, a PIN diode driver circuit may be used to turn the PIN diode ON and OFF by conducting a DC current through the PIN diode and applying a reverse bias voltage across the PIN diode, respectively.

In one implementation, PIN diodes are used in an impedance match network configured to match a varying load impedance of a plasma load to a desired impedance (e.g., 50Ω) into which a high-power RF generator can deliver power. In such an implementation, the PIN diodes serve to connect or disconnect reactive components, typically capacitors, of the impedance matching network to quickly alter the properties of the matching network by switching the reactive elements in and out of the network.

Turning now to FIG. 7A, which illustrates a model 700-*a* for a PIN diode in the ON state. In some examples, the PIN diode may be used as a switch (e.g., switch S1, S2, etc., in FIGS. 6A and/or 6B) in a variable reactance element, according to various aspects of the present disclosure. PIN diodes may be used as switches in variable reactance elements because they act like a small resistor (e.g., 0.15Ω) for RF current in the ON state and as a small capacitor (e.g., 4 pF) in the OFF state. As seen in FIG. 7A, the PIN diode model 700-*a* comprises an anode 710-*a*, a cathode 711-*a*, an inductor 701-*a*, and a resistor 702-*a*, where the inductor 701-*a* and the resistor 702-*a* appear in series. A typical value for the inductance of the inductor 701-*a* in FIG. 7A may be around 1 nH and a typical value for the resistance of the resistor 702-*a* may be around 0.15Ω.

FIG. 7B illustrates a model 700-*b* for a PIN diode on the OFF state. In the OFF state, the PIN diode model 700-*b* comprises an anode 710-*b*, a cathode 711-*b*, an inductor 701-*b*, a resistor 702-*b*, and a capacitor 703, where the inductor 701-*b* is connected in series to the parallel combination of the resistor and the capacitor. A typical value for the inductance of inductor 701-*b* in FIG. 7B is around 1 nH, a typical value for the capacitor 703 is around 4 pF, and a typical value for the resistor 702-*b* is around 1.6 megaohm. The resistance of resistor 702-*b* may depend on frequency. The cited typical value may apply at a frequency of 13.56 MHz.

Figure 8B:
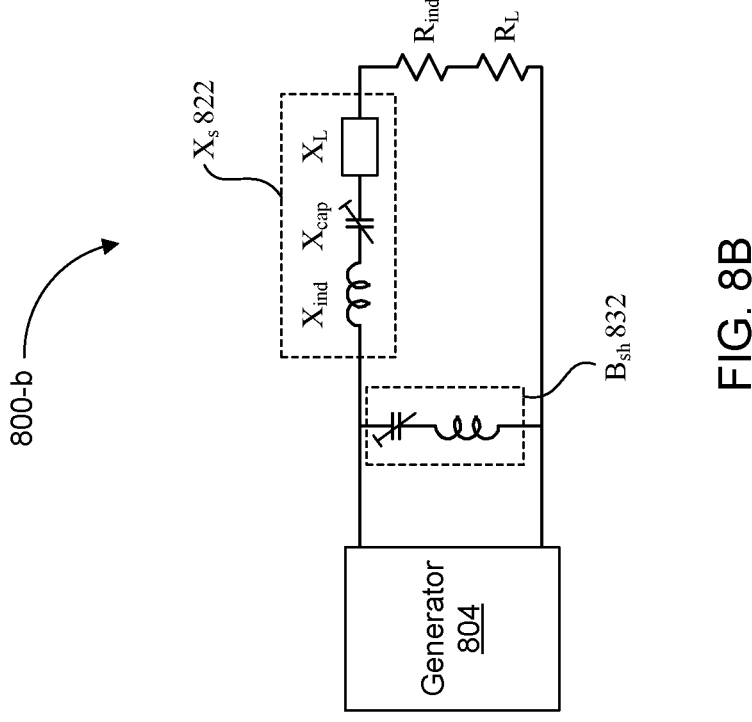
FIG. 8B illustrates a schematic diagram of an impedance matching network connecting a load to a generator in the prior art.
Figure 8A:
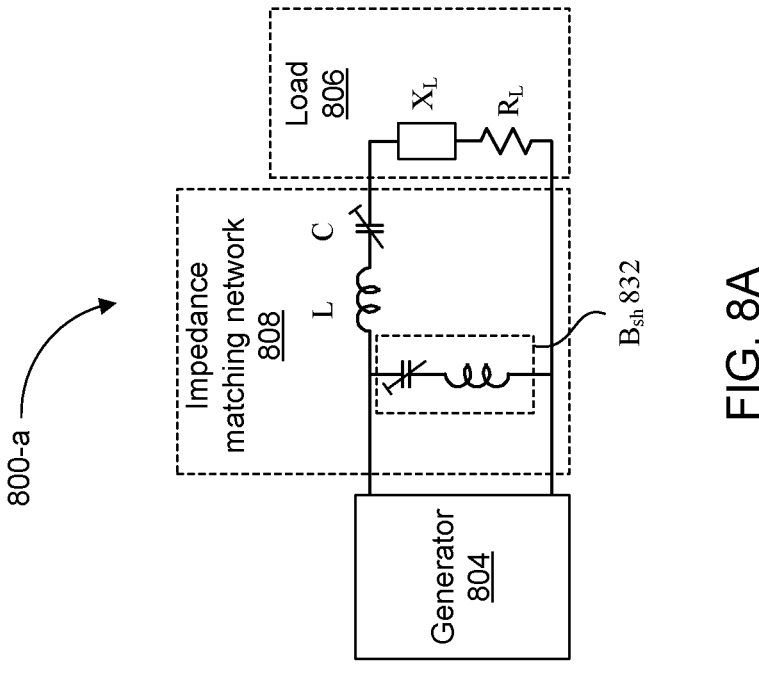
FIG. 8A illustrates a schematic diagram of an impedance matching network connecting a load to a generator in the prior art.

FIGS. 8A and 8B depict prior art power delivery systems utilizing a single stage matching network and fixed inductor (s). In some aspects, the description of FIGS. 8A-B highlight some of the efficiencies of using a fixed inductor, as is common in the prior art, for impedance match networks for power delivery systems.

FIG. 8A illustrates a block diagram of a power delivery system 800-*a* comprising an impedance matching network 808 (e.g., L-match network) for matching a load 806 to a generator 804 in the prior art. In this example, the impedance matching network 808 comprises an inductor (L), a variable capacitor (C), and shunt $B_{SH}$ 832, where shunt $B_{SH}$ 832 comprises a variable capacitor and an inductor.

FIG. 8B illustrates an equivalent circuit 800-*b* for the power delivery system 800-*a* of FIG. 8A. In some embodiments, a L-match network, such as the impedance matching network 808 shown in FIG. 8A, can be utilized to match the load impedance $R_L + jX_L$ to an input impedance (e.g., 50Ω) if $R_L + R_{ind} \leq 50$ where $R_{ind}$ is the resistance of the inductor L. The dominant loss mechanism in a match of this type may be the resistance, $R_{ind}$, of the inductor L. As an example, the impedance matching network 808 may be designed to match the load 806 to an input impedance (e.g., 50Ω) for values of the load resistance ($R_L$) between 0.6 and 30Ω and for values of the load reactance ($X_L$) between −50 and 50Ω. The calculated total series reactance ($X_s$ 822) for matching the load 806 to the input impedance (e.g., 50Ω) at the input of the match 808 is $\pm\sqrt{50 \times (R_L + R_{ind}) - (R_L R_{ind})^2}$. $X_s$ consists of the sum of the reactance of the inductor L, the capacitor C, and the load reactance $X_L$. Specifically, $X_S$ 822 can be calculated as the sum of the reactance ($X_{ind}$) of the inductor L, the reactance ($X_{cap}$) of the capacitor, and the reactance ($X_L$) of the load. That is, $X_S$ 822=$X_{ind}+X_{cap}+X_L$. As shown above, $$X_s^2$$

is a quadratic function of ($R_L + R_{ind}$) and reaches a maximum value of 625 (i.e., $25^2$) when ($R_L + R_{ind}$)=25. For this match network topology utilizing a capacitive shunt element, the total series reactance $X_s$ can be selected to have a positive value, so $X_{ind} + X_c = 75$ when $X_L = -50$ and $R_L = 25 - R_{ind}$. The capacitance of the capacitor C is limited (for vacuum variable capacitors a typical limit is 2 nF, which at a typical RF frequency of 13.56 MHz for plasma processing chambers corresponds to a reactance of −5.9Ω, so $X_{ind}$ can be calculated to be at least 75 minus the maximum reactance of the capacitor, or 75−(−5.9)=80.9Ω. With $X_{ind}$ equal to or greater than 80.9Ω, the minimum value of the reactance ($X_{ind}$) of the inductor L may be selected to be 85Ω. The quality factor, Q, of the inductor L may be at or around 500. As noted above, the resistance, $R_{ind}$, of the inductor can be calculated using the quality factor, Q, and the reactance, $X_{ind}$. In this example, the resistance can be calculated as $R_{ind}$=85/500=0.17Ω. If $R_{ind}$ is the only lossy element in the impedance matching network (or if the resistance of the other lossy elements is negligible compared to the resistance of the inductor) and the load resistance ($R_L$)=0.6Ω, the efficiency of the match can be calculated to be 0.6/(0.6+0.17) or approximately 78%.

FIG. 9A is a block diagram 900-*a* illustrating an example of a two-stage solid state match 900 incorporating a first stage 920 (or coarse stage 920) and a second stage 910 (or fine/precision stage 910), according to various aspects of the disclosure. The two-stage SSM 900 may be similar or substantially similar to the two-stage SSM 102 previously described in relation to FIG. 1. As shown the coarse first stage 920 includes a coarse series element 922 and a coarse shunt element 930, where the coarse series element 922 comprises series connected reactance modules 924 and series connected reactance modules 926. The series connected reactance modules 924 comprises a plurality of reactance modules 925 (e.g., capacitive reactance modules). Similarly, the series connected reactance modules 926 comprises a plurality of reactance modules 927 (e.g., inductive reactance modules). In this example, there are two reactance modules 925 and six reactance modules 927, although this is not intended to be limiting. Different numbers of reactance modules (i.e., capacitive and inductive reactance modules) are contemplated in different embodiments. In some cases, the coarse series element 922 implements one or more aspects of the switched variable reactance element 600-*b* described above in relation to FIG. 6B. Additionally, or alternatively, the coarse shunt element 930 implements one or more aspects of the switched variable reactance element 600-*a* described above in relation to FIG. 6A. It is also possible to implement coarse series element 922 using one or more aspects of switched variable reactance element 600-*a* as well as using one or more aspects of switched reactance element 600-*b* in the implementation of coarse shunt element 930. For the purposes of this disclosure, the term "switched variable reactance element" may be used to refer to an element (e.g., coarse series element 922, coarse shunt element 930) comprising a plurality of reactance modules (e.g., reactance modules 925, 927). Alternatively, the term "switched variable reactance element" may refer to a reactance module (e.g., reactance module 925, reactance module 927) comprising at least a reactance and a switch, where the switch is arranged in parallel or series with said reactance.

In some cases, each of the coarse series element 922 and the coarse shunt element 930 comprises a plurality of switched reactance elements. Specifically, the coarse series element 922 and the coarse shunt element 930 comprise a sufficient number of switched reactance elements (without more). Sufficient without more means that the minimum number of switched reactance elements are used that covers the required reactance range without exceeding the maximum voltage or current that each switched reactance element can withstand. To illustrate this with one non-limiting example, assume that the series reactance element needs to cover the reactance range from −30 to +55, the maximum load current is 60 A, and the maximum voltage that each switched reactance module can withstand is 650 V. Then, for a reactance of the design of coarse series element 922 where the switched reactance modules 925 and 927 are in series, the maximum absolute value that each switched reactance can contribute to the total reactance is 650/60 V/A or approximately 10.83Ω. Furthermore, to cover the reactance range of (55−(−30))=85Ω with the 10.83Ω limitation means that a minimum of 85/10.83 or 7.84 modules may need to be used. Since the number or switched reactance modules is an integer, that means that a sufficient without more number of switched reactance modules is 8 for this example. Other factors, e.g., the ability of the precision second stage to match the intermediate impedance to the target input impedance, may dictate the use of more modules in the coarse stage than what may be calculated by just considering reactance range and maximum voltage and current. In this example, the coarse series element 922 comprises eight (8) switched reactance elements, namely two reactance modules 925 (e.g., a first module having a −jX$_1$ element and a second module having a −jX$_2$ element, where X$_1$ and X$_2$ may be the same or different) and six reactance modules 927. In the example shown, the series connected reactance modules 926 comprises a first reactance module 927 having a jX$_3$ element, a second reactance module 927 having a jX$_4$ element, a third reactance module 927 having a jX$_5$ element, a fourth reactance module 927 having a jX$_6$ element, a fifth reactance module 927 having a jX$_7$ element, and a sixth reactance module 927 having a jX$_8$ element. The reactances X$_3$-X$_8$ may have the same or different value. In one non-limiting example, X$_3$ through X$_8$ may each be equal to 10.83. Additionally, in one non-limiting example, X$_1$ and X$_2$ may each be equal to 10 (i.e., the impedance of the reactances switched into and out of the coarse series reactance element 922, are j10.83 for the six reactance modules 927 and −j10 for the two reactance modules 925.) In some examples, the coarse shunt element 930 may consist of more than three switched reactance elements (e.g., 9 switched reactance elements), although only 3 are shown for the sake of brevity.

In one non-limiting example, the matching network 900 (or two-stage SSM 900) may be designed for a maximum RMS load current of 60 A. In this example, the peak RF voltage developed over a switched reactance element with a reactance of 10.83Ω can be calculated to be an RMS voltage of around 650 V. In this example, 650 V may be the maximum RMS voltage that may be safely allowed over a switched reactance module so no fewer switched reactance elements may be used to achieve the same impedance range (i.e., if fewer switched reactance elements were used and the impedance range of the coarse series element remains the same (e.g., a range from −j30 to +j55Ω), the absolute value of the reactance of each element must be increased to more than 10.83, but then 60 A multiplied by the higher absolute value of the reactance would result in a voltage higher than 650 V over the switched reactance element which can be damaging to the switched reactance module.) In this example, the minimum impedance range of the coarse series element 922 that allows the precision stage 910 to match the intermediate impedance (the impedance at the source side of the coarse first stage 920, also Z$_I$ 130 in FIG. 1) to 50Ω at the source side 904 (generator side) of the precision second stage 910 is −j30 to j55.

In some examples, either the coarse shunt element 930 or the coarse series element 922 may be a fixed reactance. For example, if the coarse shunt element 930 is a fixed capacitance and the coarse series element 922 contains eight switched reactance elements (i.e., reactance modules 925, 927), the total number of useful configurations of the coarse first stage 920 is 9. There are 2$^8$=256 different configurations of eight switches, but of those only 9 result in distinct impedances of the coarse series element when, as is the case here, the magnitude of the reactances of the switched reactance elements are the same. Those configurations that result in distinct impedances of the switched reactance elements are the "useful configurations". (Small differences in the magnitudes as a result of component tolerance or the use of e.g., −10 and 10.83 reactances result in more distinct impedances, but these small deviations are not considered useful). As another example, the coarse series element 922 may contain 8 switched reactance elements (i.e., reactance modules 925, 927) shown in FIG. 9A, and the coarse shunt element 930 may contain 9 switched reactance elements for a total of (9+1)×(8+1)=90 useful configurations. Note that only a small fraction of the total number of ON/OFF combinations of the switches in the switched reactance elements are "useful configurations" because no fractional reactances are used in the coarse section. Instead, multiple reactances of the same absolute value may be used. For instance, X$_1$=X$_2$, and X$_3$=X$_4$=X$_5$=X$_6$=X$_7$=X$_8$, and |X$_1$|≈|X$_3$|. This may be contrasted with the situation in the precision second stage 910 where fractional reactance values are used to match the intermediate impedance (Z$_1$) to the desired input impedance with the required precision. A typical impedance matching network may specify that the input impedance can be matched to the target (desired) input impedance Z$_T$ (typically 50Ω) with a return loss better than 27 dB, meaning that $$\frac{|Z_{in} - Z_t|}{|Z_{in} + Z_t^*|} < 10^{-\frac{27}{20}} \approx 0.045$$

is desired. To match a load of 0.6+jXΩ (the load reactance, X, does not influence the required precision calculated here) to 50Ω with this precision with a L-match may require a precision in the series reactance element of 0.241Ω. With a reactance range of 85Ω, this means at least 85/0.241 or approximately 353 steps, or 8 full valued steps and 6 fractional reactance steps for the series reactance element. The use of full-valued and fractional steps means that 14 switched reactance elements may be used in this example rather than 353 switched reactance elements if only full-valued switched reactance elements were used. Similar considerations apply to a shunt element of an L-match, meaning that typically at least 353$^2$=124609 configurations of the precision second stage (e.g., 910, 108) may be required in this example application to achieve the specified precision, i.e., a return loss of better than 27 dB. Although an L-match is used as an example, similar considerations apply to other match topologies and in general a large number of configurations (e.g., >125000) may be required in the precision second stage to achieve the specified precision. While the coarse first stage in this example has 90 useful configurations, the number of useful configurations in the precision second stage 910 may be significantly higher (e.g., >100,000; >500,000; between 100,000 to 500,000; around 1 million, to name a few).

In some examples, switched reactance elements (e.g., $-jX_1$, $-jX_2$, $jX_3$, $jX_4$, etc. with $X_1$, $X_2$, ..., $X_8$ all positive) of opposite signs may be used in the coarse first stage 920 to optimize efficiency of the match network, as compared to the prior art. As shown, the coarse series element 922 contains both capacitive (e.g., $-X_1$, $-X_2\Omega$, with $X_1$ and $X_2$ both positive) and inductive (e.g., $X_3$ through $X_8\Omega$, with $X_3$ through $X_8$ all positive) switched reactances. The fixed capacitive reactance 928 (e.g., $-X_9\Omega$ reactance, where $X_9$=10) may or may not be employed depending on the user case or application. An instance where a fixed reactance, such as the $-jX_9$ reactance 928, may be utilized is when the output may be subjected to a lower frequency RF signal and a fixed capacitive element such as $-jX_9$ 928 can be used to drop most of the lower frequency voltage over said fixed capacitive element. In some other cases, a fixed inductive element (e.g., $10\Omega$, $10.83\Omega$ reactance) may be used, for instance, if the output of the match is subjected to high frequency RF signal(s). Such conditions may arise in multi-frequency matches.

In some cases, the efficiency of the matching network 900 is based on the losses (if any) of the reactances (e.g., $-jX_1$, $-jX_2$, $jX_3$, $jX_4$, etc.) and switches 977 of the switched reactance modules 924 and 926. FIG. 9A provides insight into the losses of the switched reactance modules 924 and 926 by way of the resistors (e.g., resistors $R_1$ through $R_8$, resistors $R_{s\_1}$ through $R_{s\_8}$) arranged in series with the switches 977 and/or reactances. In some aspects, the resistance values of the resistor(s) shown in the switched reactance modules 924 and 926 are based at least in part on the properties of the reactances and the switches. Said another way, the efficiency of the matching network 900 is based at least in part on the properties of the reactances and switches of the switched reactance modules 924, 926.

In one non-limiting example, $X_1$=$X_2$=10. Additionally, each switch 977 in the two reactance modules 925 (or $-j10$ switched reactance module 925) may be implemented using 16 PIN diodes in parallel. As depicted in circuit 900-$b$ in FIG. 9B, if the ON resistance of each PIN diode, $R_{PIN\_ON}$, is around $0.15\Omega$, the resistance in series with the switch-can be calculated as:

$$\frac{R_{PIN\_ON}}{\text{Number of } PIN \text{ diodes}} = \frac{0.15}{16} = 0.009375 \ \Omega$$

In this example the RF frequency is 13.56 MHz and the equivalent parallel resistance of each PIN diode in the OFF state at 13.56 MHz is around 1.6 megaohm. With 16 PIN diodes in parallel, the resistance parallel to the capacitor when the PIN diodes are OFF can be calculated to be $R_{PIN\_OFF}$/16, or around 1.6/16 megagohm or 100 k$\Omega$. In some examples, the reactance is created as the parallel combination of an inductor (e.g., having a reactance of 20 and a Q of 500) and a capacitor (e.g., having a reactance of $-6.67$). In such cases, the equivalent parallel resistance of the reactance created using both the capacitor and the inductor may be lower (more lossy) than the equivalent parallel resistance when just a capacitor is used alone (e.g., a 30 kiloohm equivalent parallel resistance is achievable when using just a capacitor with a reactance of $-10$). For instance, using the value of 10 kiloohm for the equivalent parallel resistance of the capacitor and inductor in parallel, and 100 kiloohm as the equivalent parallel resistance of the PIN diodes in the OFF state (i.e., in parallel to the capacitor when the 16 PIN diodes are OFF), the total parallel resistance ($R_P$) of the open switch can be calculated as:

$$R_P = \frac{1}{\frac{1}{100} + \frac{1}{10}} k\Omega \approx 9.09 \ k\Omega$$

The reason for using an inductor with a reactance of 20 parallel to a capacitor with a reactance of $-6.67$ rather than just a capacitor with a reactance of $-10$, despite the slightly higher losses using this arrangement, is so that the match 900 can be used in applications where the load side of the match may be subjected to high voltage at a lower frequency such as arises in dual or multi-frequency matching networks. For example, if the load side of match 900 is subject to 1 kV at 400 kHz and match 900 is designed for use at 13.56 MHz, the reactance of the $-10\Omega$ reactance module 925 at 400 kHz is $0.952\Omega$ whereas the reactance of the fixed $-10\Omega$ reactance 928 at 400 kHz is $-339\Omega$. With both capacitive reactance modules 925 switched into the coarse series element 922, the reactance of the series reactance module at 400 kHz is $-339+2\times0.952\approx-337\Omega$, the current is $1000/337\approx2.9$ A and the voltage developed over the $-10\Omega$ reactance module 925 at 400 kHz is only $0.952\times2.9\approx2.8$ V.

The resulting series model for the open switch is calculated as $1/(1/(-10i)+1/9090)$ $0.0110-10i$ or a capacitive reactance (e.g., reactance of $-10$) in series with a resistor (e.g., having a resistance value of around $0.011\Omega$). That is, $X_1$=$X_2$=10, and $R_1$=$R_2$=$0.011\Omega$, and $R_{S\_1}$=$R_{S\_2}$=$0.009375\Omega$. In one non-limiting example, $X_3$=$X_4$=$X_5$=$X_6$=$X_7$=$X_8$=$10.83\Omega$, $R_3$=$R_4$=$R_5$=$R_6$=$R_7$=$R_8$=$0.0224\Omega$, and $R_{S\_3}$=$R_{S\_4}$=$R_{S\_5}$=$R_{S\_6}$=$R_{S\_7}$=$R_{S\_8}$=$0.015\Omega$. In some examples, 10 PIN diodes arranged in parallel may be used to implement each switch 977 of the reactance modules 927. Using these example values, 9 settings of the coarse series element 922 can be determined based on which of the reactances (e.g., $-jX_1$, $-jX_2$, $jX_3$ etc.) are switched in or out of the impedance match network. For example, a first setting may correspond to a scenario where only the fixed capacitive reactance 928 (e.g., $-j10$ reactance) and the two reactance modules 925 each having the $-j10$ reactance are switched in. That is, the six reactance modules 927 are switched out of the match network. The reactance for the first setting can then be obtained by summing the three $-j10$ reactances. Similarly, a second setting may correspond to a scenario where only the fixed capacitive reactance and one of the two reactance modules 925 having the $-j10$ reactance are switched in, in which case the second setting corresponds to two $-j10$ reactances. Thus, the 9 settings of the coarse series element 922 may comprise reactances of $-30$, $-20$, $-10$, 0.83, 11.67, 22.5, 33.33, 44.17, and $55\Omega$. Additionally, the corresponding series resistances of the coarse series element 922 may be calculated as shown in block diagram 900-$c$ in FIG. 9C. For instance, for setting 1 (i.e., when the six reactance modules 927 are switched out of the impedance match network), the corresponding series resistance of the coarse series element is calculated as a sum of the resistances $R_1$ and $R_2$, and resistances $R_{S\_3}$ through $R_{S\_8}$. Using the example values for $R_1$, $R_2$, $R_{S\_3}$, etc., the series resistance for the first setting may be calculated to be around $0.112\Omega$. Similarly, the series resistance for the second setting can be calculated by summing $R_1$ and $R_{S\_2}$ through $R_{S\_8}$, which gives a value of around $0.110\Omega$. Thus, the 9 settings of the coarse series element 922 may comprise resistances of 0.112, 0.110, 0.109, 0.116, 0.124, 0.131, 0.138, 0.146, and $0.153\Omega$. (Exact calculation of the resistance in the case where the switch is closed involves summing the admittance of the impedance (e.g., $1/(R_1-jX_1)$) to the admittance of the switch (e.g., $1/R_{S\_1}$), but the error in assuming that the resistance is $R_{S\_1}$ is extremely small. E.g., $1/(0.011-j10)+1/0.009375\approx0.00937498-0.00000879\approx0.009375$.) In all cases, the series resistance of the coarse series element is lower than that of the equivalent conventional match of FIG. 8A. Similar models for the losses in the coarse shunt element 930 and the variable reactance elements of the precision second stage 910 apply and are used to calculate the overall match efficiency. E.g., for the coarse shunt element 930 of FIG. 9A, the shunt susceptances are 0.01, 0.0156, 0.0211, 0.0267, 0.0322, 0.0378, 0.0433, 0.0489, 0.0544, 0.06 siemens and the corresponding shunt conductances are calculated as 3.89, 14.21, 24.52, 34.84, 45.16, 55.48, 65.79, 76.11, 86.43, and 96.75 microsiemens based on the assumed properties of the reactive elements and switches used. For the variable reactance elements in the precision second stage it is assumed that the quality factors of both the fixed and variable reactance elements are 500 based on analyses of the design.

Figure 10A:
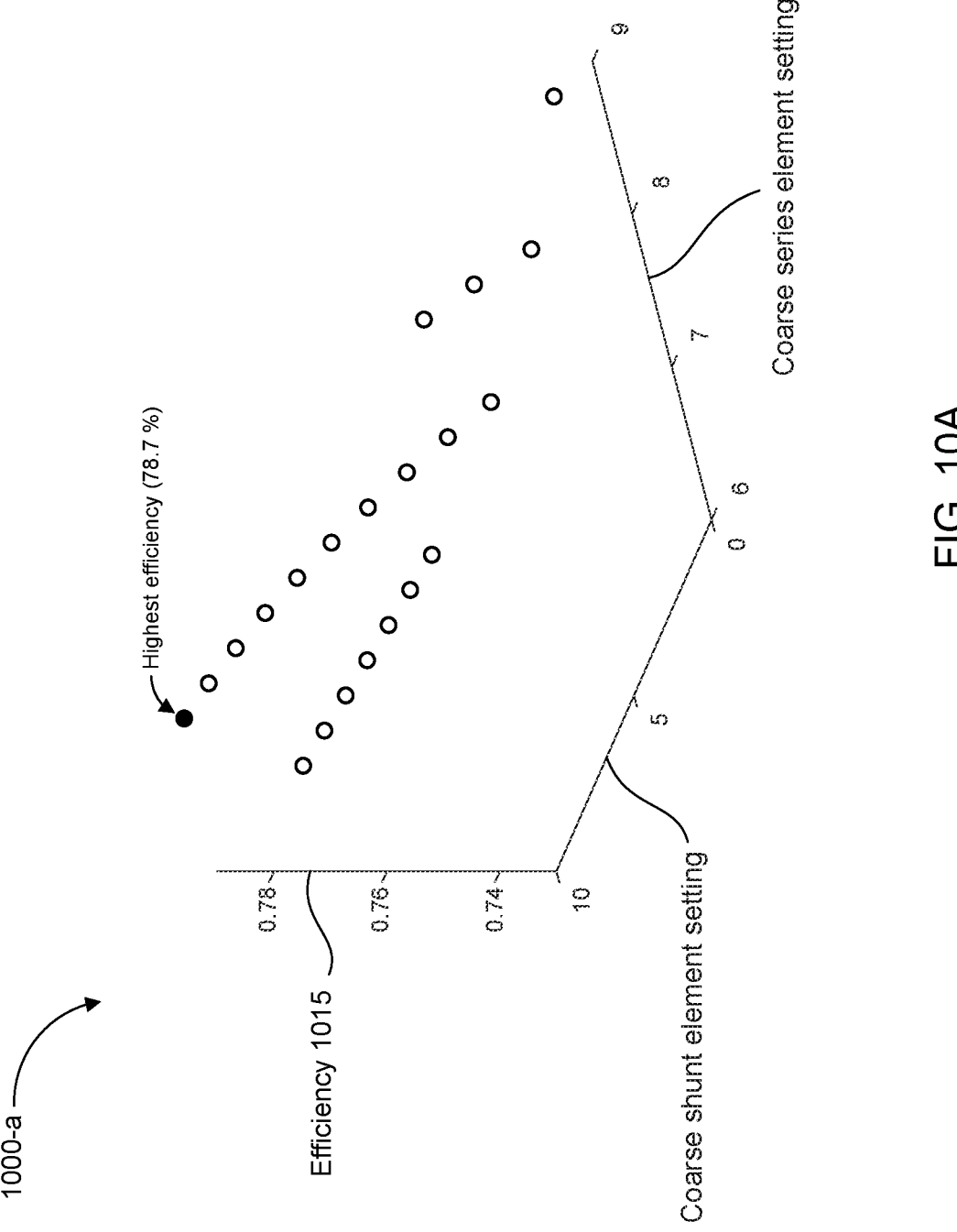
FIG. 10A illustrates efficiency as a function of coarse stage settings, according to various aspects of the disclosure.

FIG. 10A illustrates a conceptual graph 1000-*a* showing efficiency 1015 of a two-stage SSM as a function of settings for the first stage of the two-stage SSM, according to various aspects of the disclosure. Specifically, graph 1000-*a* shows the efficiency for the two-stage match 900 of FIG. 9A as a function of the settings of the coarse first stage 920 for a load impedance of $0.6-j20\Omega$, where the settings of the coarse first stage 920 includes one or more of the settings of the coarse shunt element 930 and the settings of the coarse series element 922. In some cases, electrical efficiency 1015 or efficiency of the SSM 1015 can be calculated as the ratio of the power leaving the match to the power entering the match. It should be noted that, A FIG. 10A only depicts the settings of the coarse first stage 920 that can be mapped by the precision second stage 910 to the desired input impedance (e.g., $50\Omega$). In some instances, the number of settings as well as the configurations/values/variables corresponding to the settings may be based in part on the design of the precision second stage. In this example, there are 4 settings of the coarse series element 922 that have corresponding settings of the coarse shunt element 930 that can be mapped by the precision second stage 910 to $50\Omega$. Each of the settings (numbered from 1 through 9 in this example) of the coarse series element 922 correspond to one of the reactances (e.g., $-30\Omega$, $-20\Omega$, $-10\Omega$, $0.83\ \Omega$, $11.67\ \Omega$, $22.5\ \Omega$, $33.33\ \Omega$, $44.17\Omega$, and $55\Omega$) of the series element 922. For example, the first setting (or setting 1) corresponds to a $-30\Omega$ reactance of the series element 922 when the three (3) $-j10$ reactance modules 925 and 928 are active/in use, second setting (or setting 2) corresponds to a $-20\Omega$ reactance of the series element when the $-j10$ reactance module 928 and one of the two (2) $-j10$ reactance modules are active/in use, and so on.

In this example, the settings of the coarse shunt element 930 correspond to evenly spaced susceptances of 0.01 to 0.06 siemens. In some cases, the ON and OFF properties of the switches, as well as the quality factors of the capacitors in the coarse shunt 930 may be used for calculating the performance (e.g., in terms of efficiency) of the two-stage match. Calculation of the performance is done by solving for the currents and voltages in the circuit of the match 900 including the lossy nature of the various elements in the match using standard circuit analysis techniques as is well known in the art and then calculating the quantities of interest (e.g., input impedance and efficiency) from the solved voltages and current. The precision second stage 910 is assumed to be a variable source side shunt and variable series element L-match (Configuration No. 18 in table 220 of FIG. 2). In one non-limiting example, the series element may include a fixed inductor ($jX_{10}$ in FIG. 9A) with reactance $j10$ and a Q of 500 arranged in series with a switched variable capacitor ($C_{VAR\_1}$ in FIG. 9A), where the switched variable capacitor has a Q of 500 and can be adjusted between 200 pF and 2 nF. The variable source side shunt element of the precision second stage 910 may comprise a switched variable capacitor ($C_{VAR\_2}$ in FIG. 9A) that can be adjusted between 200 pF and 4 nF with a Q of 500. With these example values, the setting of the coarse first stage 920 that results in the most optimal efficiency 1015 of the impedance matching network 900 is found where the coarse series element 922 is set to setting 7 (i.e., to a reactance of $33.33\Omega$) and the coarse shunt element 930 is set to setting 10 (i.e., to a susceptance of 0.06 siemens).

Figures 10B, 10C:
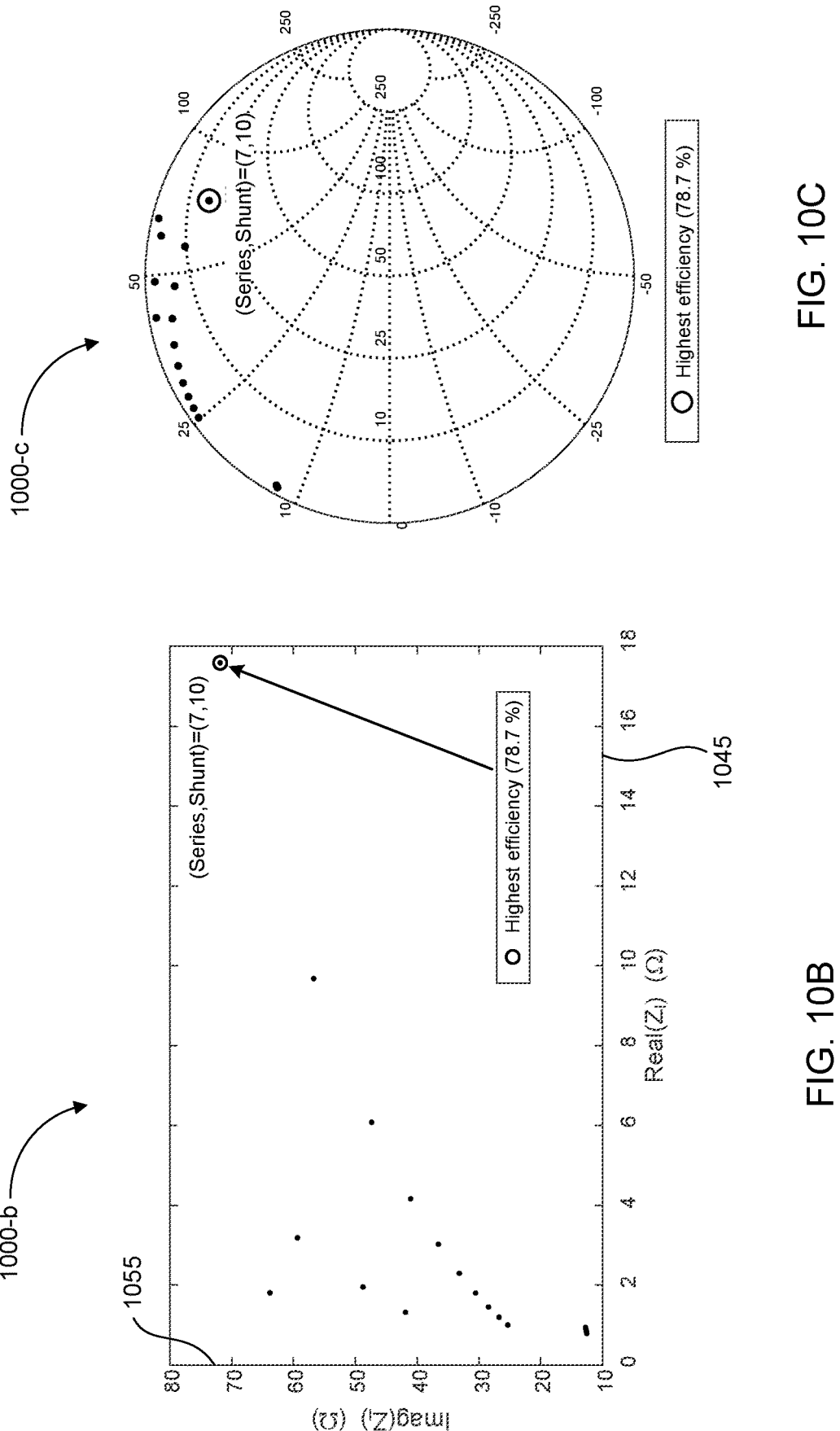
FIG. 10B illustrates intermediate impedance as a function of coarse stage settings, according to various aspects of the disclosure.
FIG. 10C illustrates intermediate load reflection coefficient as a function of coarse stage settings, according to various aspects of the disclosure.

FIG. 10B illustrates a conceptual graph 1000-*b* showing the intermediate load impedance 1055 (i.e., the impedance seen at the source side of the coarse first stage, such as, $Z_1$ 130 in FIG. 1) as a function of the settings of the coarse first stage for a load impedance, $Z_L$, 1045 according to various aspects of the disclosure. In this example, the load impedance ($Z_L$) is $0.6-j20\Omega$. FIG. 10B only depicts those settings (i.e., series and shunt settings) that can be mapped, e.g., to $50\Omega$, by the precision second stage. The setting configuration (series setting=setting 7 corresponding to a reactance of $33.33\Omega$, shunt setting=setting 10 corresponding to a susceptance of 0.06 siemens) for the coarse series and shunt elements 922 and 930, respectively, that helps achieve the most optimal efficiency corresponds to an intermediate impedance of $17.6+j71.8\Omega$.

FIG. 10C illustrates a smith chart 1000-*c*, according to various aspects of the disclosure. The smith chart 1000-*c* implements one or more aspects of the graph 1000-*b* previously described in relation to FIG. 10B. Here, each intermediate load impedance (i.e., the impedance seen at the source side of the coarse first stage, such as, $Z_I$ 130 in FIG. 1) is expressed as a load reflection coefficient with respect to $50\Omega$. The load reflection coefficient(s) of the intermediate load impedance(s) with respect to $50\Omega$ can be calculated as follows: $(Z_I-50)/(Z_I+50)$. Additionally, the intermediate load impedance for the impedance resulting in the highest efficiency is also expressed as a function of the settings of the coarse first stage for a load impedance, where the load impedance is $0.6-j20\Omega$.

Figures 11A, 11B, 11C:
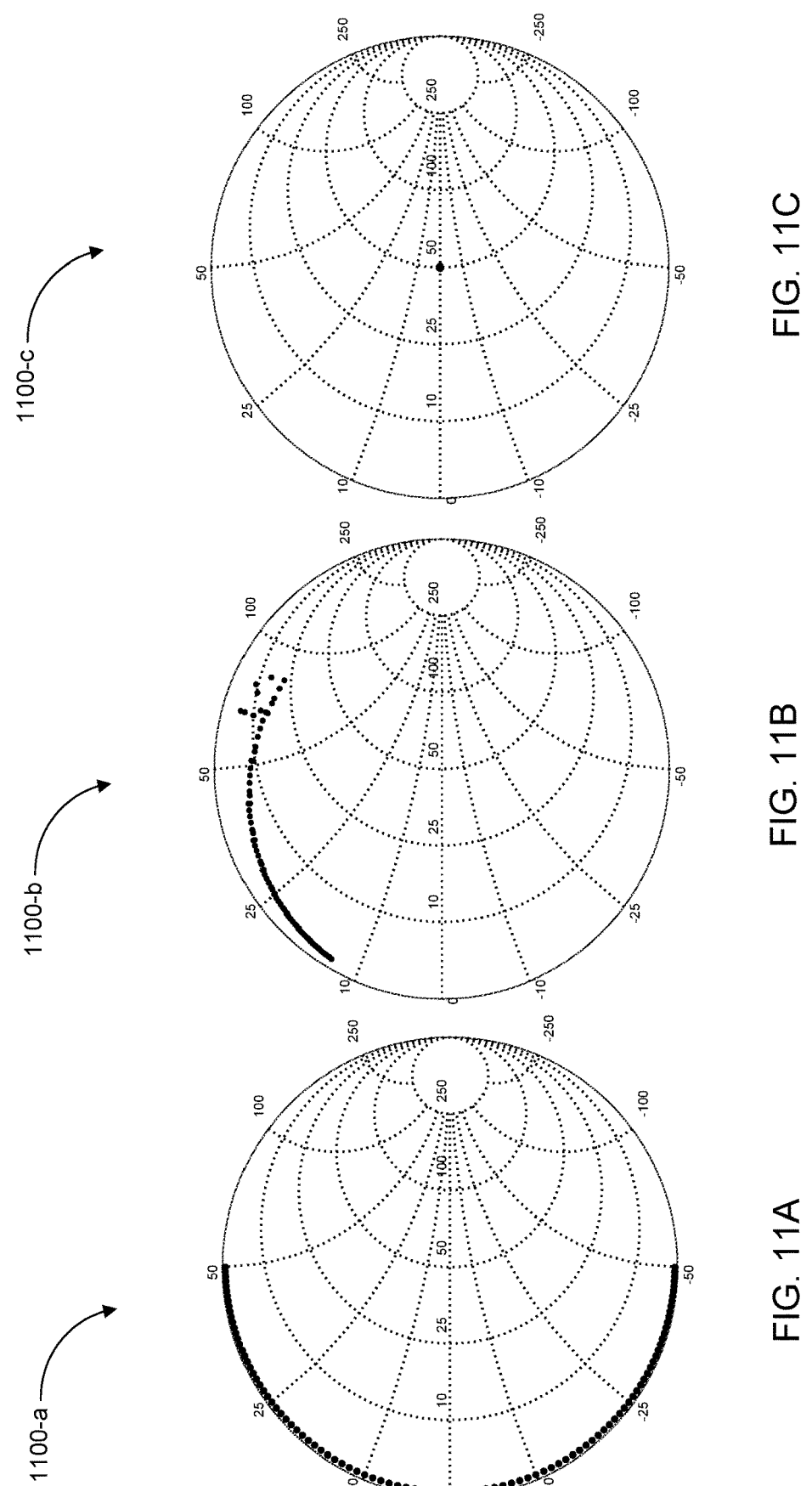
FIG. 11A illustrates a Smith Chart showing load reflection coefficients, according to various aspects of the disclosure.
FIG. 11B illustrates a Smith Chart showing intermediate load reflection coefficients, according to various aspects of the disclosure.
FIG. 11C illustrates a Smith Chart showing input reflection coefficients, according to various aspects of the disclosure.

FIGS. 11A, 11B, and 11C show smith charts 1100-*a*, 1100-*b*, and 1100-*c*, respectively. Specifically, the smith charts 1100 depict the mapping of load impedance ($Z_L$) to intermediate impedances ($Z_I$) and the input impedance ($Z_{IN}$) by the two-stage solid state match 900 of FIG. 9. As illustrated in FIGS. 10A, 10B, and 10C, for a particular load impedance, there may be multiple settings for the coarse first stage 920 that allow the precision second stage 910 to map the intermediate impedance to $50\Omega$ on the source side of the match 900.

FIG. 11A shows the source impedances (i.e., 0.6+jX, where the reactance 'X' ranges from −50 to 50) as load reflection coefficients ($F_L$) with respect to 50Ω, where the load reflection coefficients ($\Gamma_L$) are calculated as follows: ($Z_L$−50)/($Z_L$+50).

FIG. 11B shows the intermediate impedances ($Z_I$) expressed as intermediate load impedance reflection coefficients ($\Gamma_I$) with respect to 50Ω, where the intermediate load impedance reflection coefficients correspond to the setting of the coarse first stage that results in the highest efficiency of the match 900. In some cases, the intermediate load impedance reflection coefficient ($\Gamma_I$) can be calculated as follows: ($Z_I$−50)/($Z_I$+50).

FIG. 11C shows the input impedance (i.e., at the source side of the match 900, such as, $Z_{in}$ 140 of FIG. 1) expressed as input reflection coefficients ($\Gamma_{IN}$) with respect to 50Ω, where the input reflection coefficient ($\Gamma_{IN}$) is calculated as follows: ($Z_{IN}$−50)/($Z_N$+50).

In some examples, the desired input impedance is set to 50Ω for all load impedances, but this is not intended to be limiting. Other input impedances (e.g., 25Ω, 37.5Ω, 75Ω, to name a few) are contemplated in different embodiments.

Figure 11D:
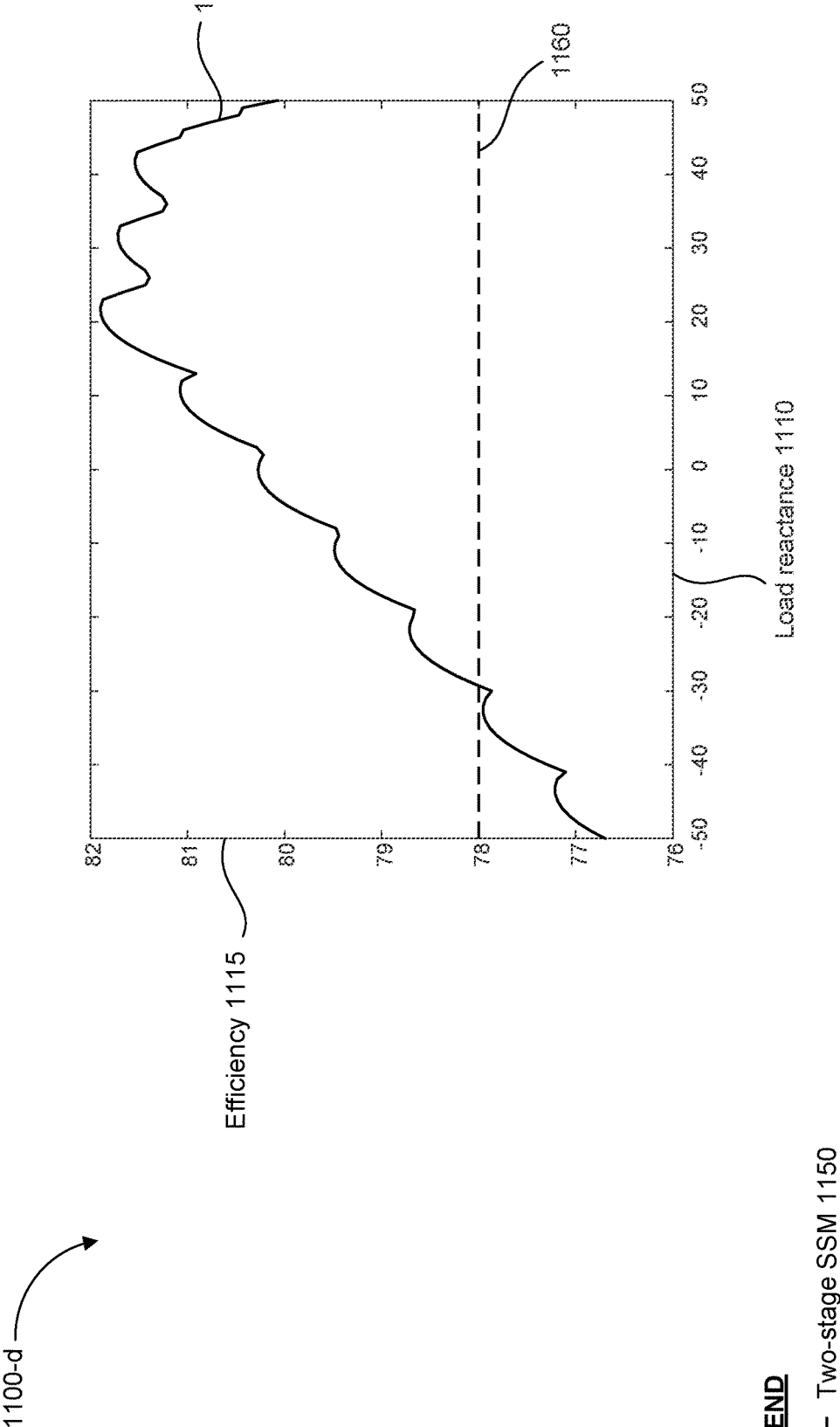
FIG. 11D illustrates a conceptual graph showing efficiency against load reactance for a two-stage SSM and an impedance match network utilizing a vacuum variable capacitor design, according to various aspects of the disclosure.

FIG. 11D illustrates a conceptual graph 1100-d depicting efficiency of impedance matching network 900 of FIG. 9 as compared to efficiency of the L-match 800-a in FIG. 8A (prior art). Here, graph 1100-d shows efficiency 1115 on the vertical axis (or y-axis) and load reactance 1110 on the horizontal axis (or x-axis). Specifically, graph 1100-d depicts efficiency 1115 of impedance matching network 900 of FIG. 9 as a function of load reactance 1110 for a fixed load resistance (e.g., 0.6Ω) as the load reactance 1110 is varied between −50 and 50. The two-stage SSM curve 1150 corresponds to the efficiency obtained if the setting resulting in the most optimum efficiency of the match 900 is used for each impedance setting. Also shown (by way of vacuum variable capacitor curve 1160) is the efficiency of the conventional L-match 800-a of FIG. 8A. As seen, the two-stage solid state match 900 of FIG. 9 helps enhance efficiency as compared to the prior-art matching network over a majority of the reactance range. In some aspects, the two-stage solid state match helps optimize performance as compared to the prior art impedance matching network (e.g., L-match 800-a in FIG. 8A) by enabling portions of the series inductor to be shorted (e.g., by closing one or more of the switches 977 in the switched reactance modules 927 in FIG. 9), such as, when a smaller inductor is employed in the match network. In some cases, the two-stage SSM may short-circuit portions of the series inductor in lieu of decreasing a capacitance value of a capacitor (e.g., C of impedance matching network 808 in FIG. 8A).

In some embodiments, efficiency of the two-stage solid state match may be further enhanced by using reactances of opposite signs in the switched reactance elements (e.g., switched reactance elements 925 with a reactance of −10 and switched reactance element 927 with a reactance of 10.83). Specifically, the series resistance range of the coarse series element 922 (i.e., for achieving the same reactance range, such as from −30 to 55) may be reduced by using reactances of opposite signs. Since the efficiency range is a function of the load resistance (e.g., 0.6 n) and the series resistance range, smaller resistance values in the series resistance range may result in a higher efficiency of the impedance matching network. In one non-limiting example, the series resistance may range from 0.185 to 0.198Ω, when the coarse series element 922 only uses switched capacitive reactances and a fixed inductive reactance. Furthermore, the series resistance may range from 0.112Ω to 0.153Ω (using the example values described in relation to FIG. 9A) when both switched capacitive and switched inductive reactances are utilized in the coarse series element 922. By reducing the overall series resistance, the efficiency may be enhanced. For instance, when operating into a load resistance of 0.6 ohm, the efficiency range can be enhanced from around 0.75-0.76 to around 0.80-0.84. Said another way, the efficiency can be enhanced by around 0.09 (or 9%) when operating into highly inductive loads and by around 0.04 (or 4%) when operating into highly capacitive loads.

In some instances, efficiency of the two-stage solid state match can be further enhanced by limiting the number of switched reactance elements in the coarse first stage.

FIG. 12 shows an example of a method 1200 for operating a two-stage solid state match, according to various aspects of the disclosure. In some embodiments, the two-stage solid state match may be similar or substantially similar to the two-stage SSM previously described in relation to FIG. 9. Furthermore, the two-stage SSM may comprise a coarse first stage (e.g., coarse first stage 920 in FIG. 9) and a precision second stage (e.g., precision second stage 910 in FIG. 9). The second stage may be coupled between the source side (e.g., source side 904) and the coarse first stage, while the coarse first stage may be coupled to the load side 905 at one end and to the second stage at another end.

At operation 1202, the method 1200 comprises determining a load impedance ($Z_L$). In some examples, the load impedance may be obtained directly through a sensor on the load side, such as load side 905 in FIG. 9, of the two-stage SSM. Alternatively, the load impedance may be indirectly obtained by measuring the impedance on the source side, such as source side 904 in FIG. 9, of the match and combining the measured impedance information with information about the properties of the match 900. (E.g., with Y the 2-port admittance parameters of match 900 for the particular setting of the variable reactance components in the match when the measurement of the source side impedance is made and with port 1 the source side port, the load impedance, $Z_L$, may be calculated as: $Z_L=$ $$\frac{Y_{11}Z_{in} - 1}{Y_{22} - (Y_{11}Y_{22} - Y_{12}Y_{21})Z_{in}})$$

In some cases, operation 1204 comprises calculating one or more intermediate impedances ($Z_I$) and corresponding match efficiencies for different settings of the coarse first stage of the two-stage SSM (i.e., impedance match network), wherein the calculating is further based at least in part on the load impedance obtained at operation 1202.

Next, operation 1206 comprises identifying a subset of settings that enable the precision second stage of the impedance match network to map the intermediate impedances ($Z_I$) to a target or desired input impedance (e.g., 50Ω).

Operation 1208 comprises applying one of the settings from the subset to the coarse first stage. In some cases, the setting selected from the subset at operation 1208 comprises the setting that maximizes overall efficiency of the impedance match network (or two-stage SSM). Operation 1208 also comprises utilizing said setting for the coarse first stage of the impedance match network.

Lastly, operation 1210 comprises adjusting the precision second stage of the impedance match network such that the intermediate impedance is mapped to the desired input impedance (e.g., 50Ω).

Although not shown, the method 1200 can be implemented in computer logic such as a non-transitory tangible computer readable medium encoded with instructions for carrying out the method 1200 for controlling the precisions and coarse stages of an SSM, such as the stages 108, 110 shown in FIG. 1 or the stages 910, 920 shown in FIG. 9A.

Figure 13:
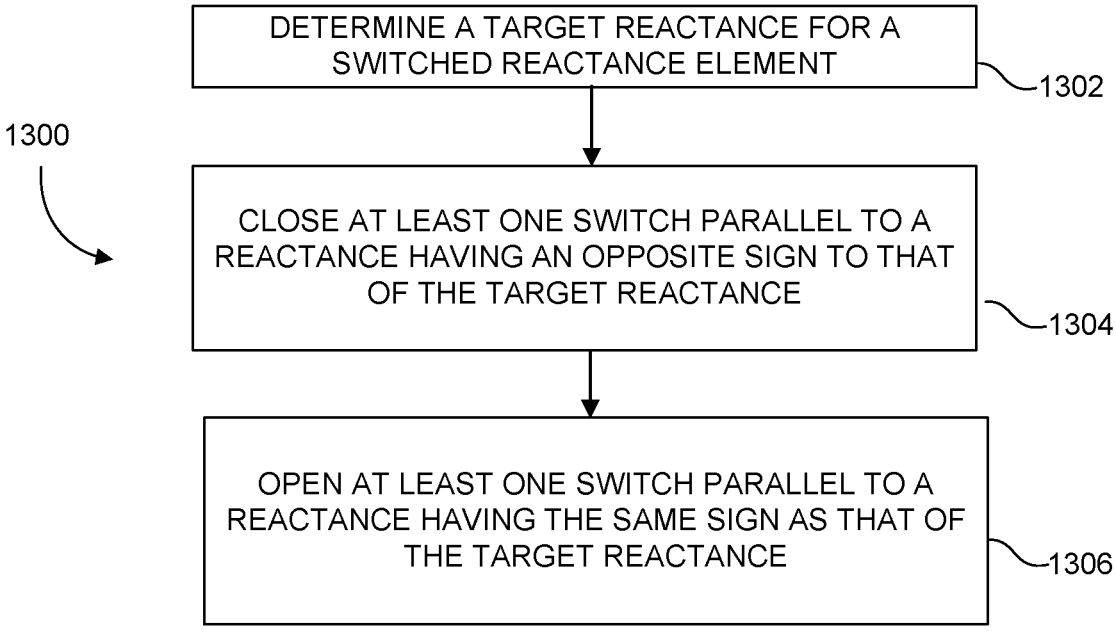
FIG. 13 illustrates an example of a method for operating a switched variable reactance element, according to various aspects of the disclosure.

FIG. 13 shows an example of a method 1300 for operating a switched reactance element, according to various aspects of the disclosure.

The method 1300 starts with determining a target reactance for a switched reactance element (operation 1302). In some examples, the target reactance may be obtained as an output of operation 1208 of method 1200. For instance, operation 1208 comprises selecting and using a setting that maximizes overall efficiency of a two-stage SSM, where the setting is one of a plurality of settings that can be used for adjusting the coarse first stage of the two-stage SSM (e.g., 110 or 920). In some cases, the setting is associated with (or corresponds to) a reactance for a switched reactance element in the coarse first stage of the two-stage SSM, as described above in relation to at least FIGS. 1 and 9.

Next, operation 1304 comprises closing at least one switch parallel to a reactance having an opposite sign to that of the target reactance. For example, when the target reactance is 11.67$\Omega$ the switch parallel to a −10$\Omega$ reactance (e.g., a switch in modules 924) is closed.

Operation 1306 comprises opening at least one switch parallel to a reactance having the same sign as that of the target reactance. For example, when the target reactance is −20$\Omega$ the switch parallel to a −10$\Omega$ reactance (e.g., a switch in modules 924) is opened.

Although not shown, the method 1300 can be implemented in computer logic such as a non-transitory tangible computer readable medium encoded with instructions for carrying out the method 1300 for controlling the precisions and coarse stages of an SSM, such as the stages 108, 110 shown in FIG. 1 or the stages 910, 920 shown in FIG. 9A.

Figure 14:
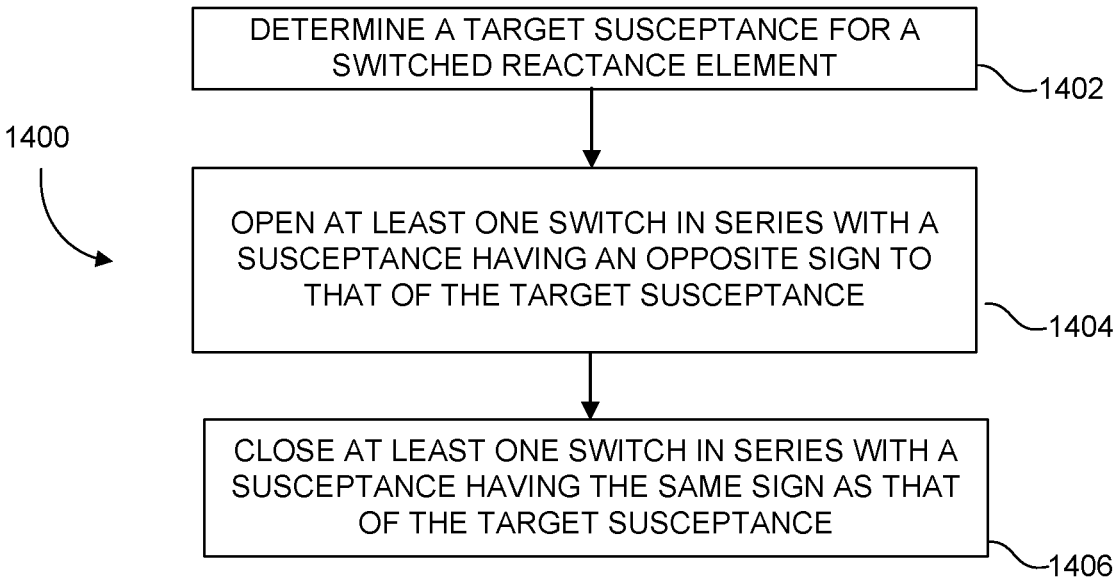
FIG. 14 illustrates an example of a method for operating a switched variable reactance element, according to various aspects of the disclosure.

FIG. 14 shows another example of a method 1400 for operating a switched reactance element, according to various aspects of the disclosure.

At operation 1402, the method 1400 comprises determining a target susceptance for a switched reactance element. Similar to operation 1302 in FIG. 13, in some examples, the target susceptance may be obtained as an output of operation 1208 of method 1200. For instance, operation 1208 comprises selecting and using a setting that maximizes overall efficiency of a two-stage SSM, where the setting is one of a plurality of settings that can be used for adjusting the coarse first stage of the two-stage SSM. In some cases, the setting is associated with (or corresponds to) a susceptance for a switched reactance element in the coarse first stage of the two-stage SSM.

Next, operation 1404 comprises opening at least one switch in series with a susceptance having an opposite sign to that of the target susceptance.

Next, operation 1406 comprises closing at least one switch in series with a susceptance having the same sign as that of the target susceptance.

Although not shown, the method 1400 can be implemented in computer logic such as a non-transitory tangible computer readable medium encoded with instructions for carrying out the method 1400 for controlling the precisions and coarse stages of an SSM, such as the stages 108, 110 shown in FIG. 1 or the stages 910, 920 shown in FIG. 9A.

Figure 15:
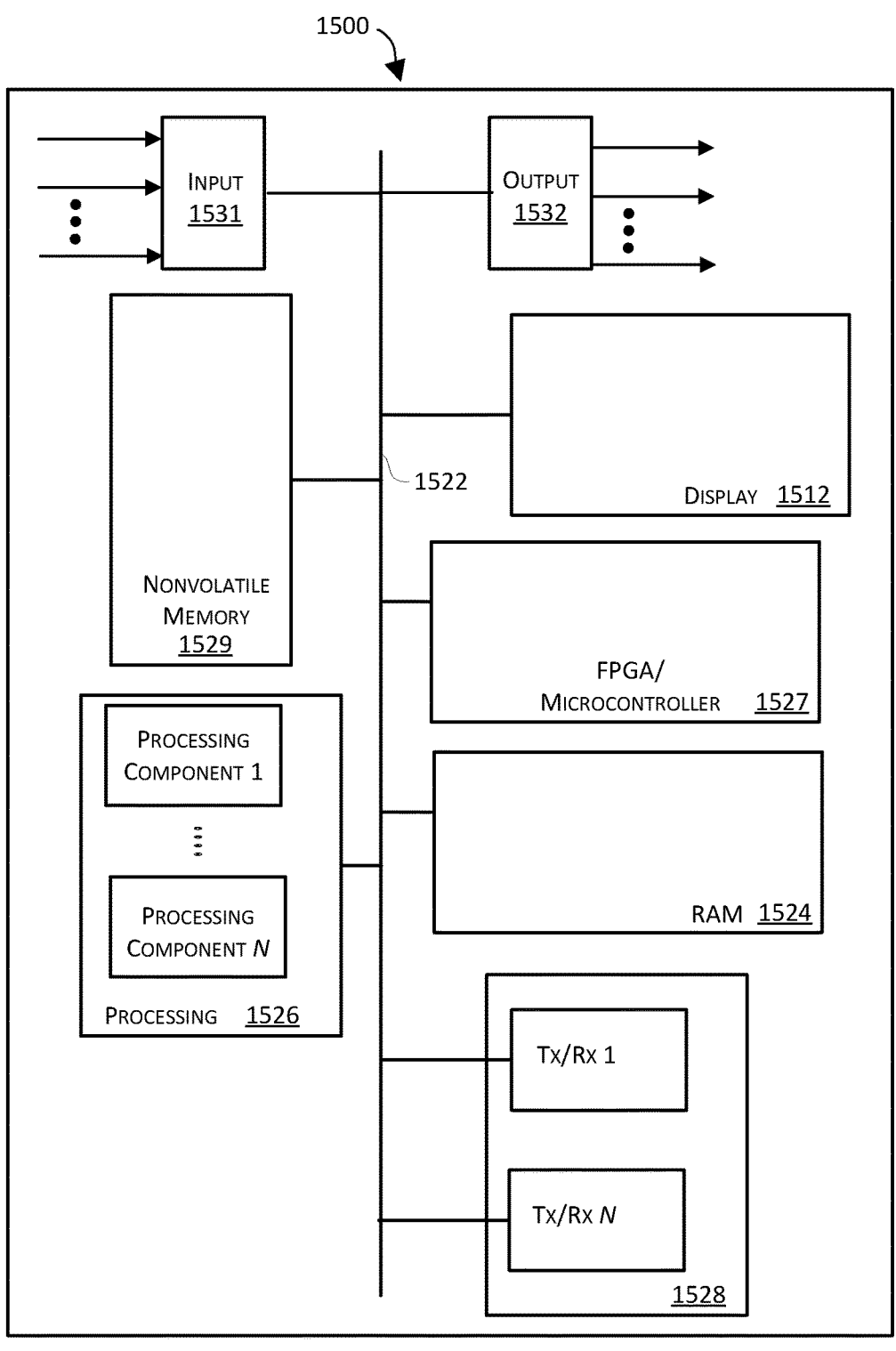
FIG. 15 illustrates a block diagram of a computer system that may be used to implement one or more aspects of the present disclosure.

FIG. 15 illustrates a block diagram of a computer system 1100 that may be used to implement one or more aspects of the present disclosure, including at least a method for operating a two-stage solid state match (e.g., described above in relation to FIG. 12). As shown, in this embodiment a display 1512 and nonvolatile memory 1529 are coupled to a bus 1522 that is also coupled to random access memory ("RAM") 1524, a processing portion (which includes N processing components) 1526, a field programmable gate array (FPGA) 1527, and a transceiver component 1528 that includes N transceivers. Although the components depicted in FIG. 15 represent physical components, FIG. 15 is not intended to be a detailed hardware diagram; thus, many of the components depicted in FIG. 15 may be realized by common constructs or distributed among additional physical components. Moreover, other existing and yet-to-be developed physical components and architectures may also be utilized to implement the functional components described with reference to FIG. 15.

A display 1512 generally operates to provide a user interface for a user, and in several implementations, display 1512 is realized by a touchscreen display. For example, display 1512 can be used to control and interact with the components described herein. In general, nonvolatile memory 1529 is non-transitory memory that functions to store (e.g., persistently store) data and machine readable (e.g., processor executable) code (including executable code that is associated with effectuating the methods described herein). In some embodiments, for example, nonvolatile memory 1529 includes bootloader code, operating system code, file system code, and non-transitory processor-executable code to facilitate the execution of the methods described herein, such as method(s) 1200-1400 in FIGS. 12-14.

In some implementations, nonvolatile memory 1529 may be realized by flash memory (e.g., NAND or ONENAND memory). In other examples, other memory types may be utilized as well. Although some examples may execute the code from the nonvolatile memory 1529, in other examples, the executable code in the nonvolatile memory may typically be loaded into RAM 1524 and executed by one or more of the N processing components in the processing portion 1526.

In operation, the N processing components in connection with RAM 1524 may generally operate to execute the instructions stored in nonvolatile memory 1529 to realize the functionality of the two-stage SSM described herein. For example, non-transitory processor-executable instructions to effectuate the methods described herein may be persistently stored in nonvolatile memory 1529 and executed by the N processing components in connection with RAM 1524. Processing portion 1526 may include a video processor, digital signal processor (DSP), graphics processing unit (GPU), and other processing components.

In addition, or in other examples, the field programmable gate array (FPGA) 1527 may be configured to effectuate one or more aspects of the methodologies described herein. For example, non-transitory FPGA-configuration-instructions may be persistently stored in nonvolatile memory 1529 and accessed by the FPGA 1527 (e.g., during boot up) to configure the FPGA 1527.

The input component 1531 may generally operate to receive signals (e.g., target precision for two-stage SSM, target input impedance, load impedance, to name a few). The output component 1532 may generally operate to provide one or more digital and/or analog signals (e.g., to a control module, to the PIN diode switches, etc.) to effectuate operational aspects of the two-stage SSM, and/or other systems described herein. In some embodiments, the computer system 1500 may be configured to perform a method for switching at least two reactances (e.g., of opposite signs, such as an inductive reactance and a capacitive reactance) in and out of a plurality of switched variable reactance elements employed in an impedance match network.

The depicted transceiver component 1528 includes N transceiver chains, which may be used for communicating with external devices (e.g., external controllers) via wireless or wireline networks. Each of the N transceiver chains may represent a transceiver associated with a particular communication scheme (e.g., WiFi, Ethernet, Profibus, etc.).

Methods 1200-1400 and other methods of this disclosure may include other steps or variations in various other embodiments. Some or all of any of method(s) 1200-1400 may be performed by or embodied in hardware, and/or performed or executed by a controller, a CPU, an FPGA, a System on Chip (SoC), a Measurement and Control Multi-Processor System on Chip (MPSoC), which may include both a CPU and an FPGA, and other elements together in one integrated SoC, or other processing device or computing device processing executable instructions, in controlling other associated hardware, devices, systems, or products in executing, implementing, or embodying various subject matter of the method.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

It will be understood that, although the terms first, second, third, etc., may be used herein to describe various elements, components, and/or sections, these elements, components, and/or sections should not be limited by these terms. These terms are only used to distinguish one element, component, or section from another element, component, or section. Thus, a first element, component, or section discussed below could be termed a second element, component, or section without departing from the teachings of the present disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the circuits in use or operation in addition to the orientation depicted in the figures. For example, if the circuit in the figures is turned over, elements described as "below" or "beneath" or "under" other elements or features would then be oriented "above" the other elements or features. Thus, the exemplary terms "below" and "under" can encompass both an orientation of above and below. The circuits and power generation components may be otherwise oriented (e.g., rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups but do not preclude the presence or addition of one or more other features, integers, steps, operations, elements, components, and/or groups thereof. As used herein, the term "and/or" includes any and all combinations of one or more of the associated listed items and may be abbreviated as "/".

It will be understood that when an element or layer is referred to as being "on," "connected to," "coupled to," or "adjacent to" another element, it can be directly on, connected, coupled, or adjacent to the other element, or intervening elements may be present. In contrast, when an element is referred to as being "directly on," "directly connected to," "directly coupled to," or "immediately adjacent to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

What is claimed is:

1. An apparatus comprising:
a load side and a source side;
a first coarse stage and a second precision stage, wherein the first coarse stage is coupled between the second precision stage and the load side, and wherein the second precision stage is coupled between the source side and an input of the first coarse stage;
the first coarse stage comprising a first switched variable reactance element, wherein the first coarse stage is configured to map a load impedance connected to the load side to a first number of intermediate impedances at the input of the first coarse stage; and
the second precision stage comprising a second switched variable reactance element is configured to map at least one of the intermediate impedances to a second number of input impedances at the source side.

2. The apparatus of claim 1, wherein the second switched variable reactance element comprises at least two reactances, comprising an inductive reactance and a capacitive reactance, and wherein the at least two reactances are configured to be switched in and out of the second switched variable reactance element.

3. The apparatus of claim 1, wherein the second number of input impedances is greater than the first number of intermediate impedances.

4. The apparatus of claim 1, wherein the first number of intermediate impedances is less than or equal to 400.

5. The apparatus of claim 1, wherein the second number of input impedances is at least 100,000.

6. The apparatus of claim 1, wherein the first coarse stage comprises:
a coarse series element and a coarse shunt element, and wherein the coarse series element or the coarse shunt element comprises the first switched variable reactance element;
wherein the coarse series element is coupled to the load side; and wherein the coarse shunt element is coupled between the coarse series element and the second precision stage.

7. The apparatus of claim 6, wherein the coarse shunt element comprises at least a first switch arranged in series with an inductive reactance and a second switch arranged in series with a capacitive reactance.

8. The apparatus of claim 6, wherein the coarse series element comprises at least a first switch arranged in parallel with an inductive reactance and a second switch arranged in parallel with a capacitive reactance.

9. The apparatus of claim 6, wherein the first coarse stage further comprises a plurality of PIN diodes.

10. An apparatus comprising:
a load side and a source side;
a first stage comprising at least one reactance element, wherein the first stage is configured to map a load impedance connected to the load side to a first number of intermediate impedances at an input of the first stage; and
a second stage comprising a first switched variable reactance element configured to map at least one of the intermediate impedances to a second number of input impedances at the source side.

11. The apparatus of claim 10, wherein the at least one reactance element comprises at least two reactances, comprising an inductive reactance and a capacitive reactance, and wherein the at least two reactances are configured to be switched in and out of the at least one reactance element.

12. The apparatus of claim 10, wherein the second number of input impedances is greater than the first number of intermediate impedances.

13. The apparatus of claim 10, wherein the first number of intermediate impedances is less than or equal to 400.

14. The apparatus of claim 10, wherein the second number of input impedances is at least 100,000.

15. The apparatus of claim 10, wherein the first stage comprises:
a coarse series element and a coarse shunt element, wherein the coarse series element or the coarse shunt element comprises a second switched variable reactance element;
wherein the coarse series element is coupled to the load side; and
wherein the coarse shunt element is coupled between the coarse series element and the second stage.

16. The apparatus of claim 15, wherein the first stage further comprises a plurality of PIN diodes.

17. The apparatus of claim 15, wherein the coarse shunt element comprises at least a first switch arranged in series with an inductive reactance and a second switch arranged in series with a capacitive reactance.

18. The apparatus of claim 15, wherein the coarse series element comprises at least a first switch arranged in parallel with an inductive reactance and a second switch arranged in parallel with a capacitive reactance.

* * * * *